US012684844B2

(12) United States Patent　　　(10) Patent No.: US 12,684,844 B2
Voerckel et al.　　　　　　　　　(45) Date of Patent:　　　Jul. 14, 2026

(54) SEMICONDUCTOR DEVICE AND METHOD OF PRODUCING THEREOF

(71) Applicant: Infineon Technologies AG, Neubiberg (DE)

(72) Inventors: Andreas Voerckel, Finkenstein (AT); Hans Weber, Bayern (DE); Tobias Franz Wolfgang Hoechbauer, Villach (AT)

(73) Assignee: Infineon Technologies Austria AG, Villach (AT)

( * ) Notice: Subject to any disclaimer, the term of this patent is extended or adjusted under 35 U.S.C. 154(b) by 697 days.

(21) Appl. No.: 17/886,533

(22) Filed: Aug. 12, 2022

(65) Prior Publication Data

US 2023/0051830 A1　　Feb. 16, 2023

(30) Foreign Application Priority Data

Aug. 13, 2021　(DE) ..................... 10 2021 121 138.7
Sep. 16, 2021　(EP) .................................... 21197278

(51) Int. Cl.
　　H10D 62/10　　　(2025.01)
　　H01L 21/04　　　(2006.01)
　　　　　　(Continued)
(52) U.S. Cl.
　　CPC ..... H10D 62/8325 (2025.01); H01L 21/0465 (2013.01); H10D 12/031 (2025.01);
　　　　　　(Continued)
(58) Field of Classification Search
　　CPC ..................... H01L 21/764; H10D 30/66–669
　　See application file for complete search history.

(56) References Cited

U.S. PATENT DOCUMENTS 5,216,275 A　　6/1993　Chen
5,981,966 A　　11/1999　Honma
　　　　　(Continued)

FOREIGN PATENT DOCUMENTS

DE　　　19736981 C2　　8/1999
DE　　102017108047 A1　10/2018
　　　　　(Continued)

OTHER PUBLICATIONS

Fundamentals of Power Semiconductor Devices, Second Edition, by B. Jayant Baliga, Section 6.22.4 Shielded Trench-Gate Power MOSFET Structure pp. 496-497 (Year: 2019).*
　　　　　(Continued)

*Primary Examiner* — Eric A. Ward
(74) *Attorney, Agent, or Firm* — Murphy, Bilak & Homiller, PLLC

(57)　　　　　ABSTRACT

A transistor device and a method for forming a transistor device are disclosed. The transistor device includes: a SiC semiconductor body that includes a first semiconductor layer and a second semiconductor layer formed on top of the first semiconductor; a trench structure extending from a first surface of the semiconductor body through the second semiconductor layer into the first semiconductor layer; a drain region arranged in the first semiconductor layer; and a plurality of transistor cells each coupled between the drain region and a source node. The trench structure subdivides the second semiconductor layer into a plurality of mesa regions and includes at least one cavity. At least one of the plurality of transistor cells is at least partially integrated in each of the mesa regions.

6 Claims, 23 Drawing Sheets

(51) Int. Cl.
H10D 12/01 (2025.01)
H10D 30/66 (2025.01)
H10D 62/832 (2025.01)
H10D 64/27 (2025.01)

(52) U.S. Cl.
CPC ......... H10D 30/668 (2025.01); H10D 62/127 (2025.01); H10D 64/513 (2025.01)

(56) References Cited

U.S. PATENT DOCUMENTS

| | | | |
|---|---|---|---|
| 6,191,447 | B1 | 2/2001 | Baliga |
| 6,313,482 | B1 | 11/2001 | Baliga |
| 6,812,525 | B2 | 11/2004 | Bul et al. |
| 8,319,278 | B1 | 11/2012 | Zeng et al. |
| 9,083,343 | B1 | 7/2015 | Li et al. |
| 11,043,560 | B2 | 6/2021 | Siemieniec et al. |
| 2003/0234423 | A1 | 12/2003 | Bul et al. |
| 2004/0012038 | A1 | 1/2004 | Kouzuki et al. |
| 2004/0266076 | A1 | 12/2004 | Doris et al. |
| 2006/0197129 | A1 | 9/2006 | Wohlmuth |
| 2006/0281249 | A1 | 12/2006 | Yilmaz et al. |
| 2007/0072397 | A1 | 3/2007 | Yamauchi et al. |
| 2007/0152268 | A1 | 7/2007 | Hille et al. |
| 2007/0194374 | A1 | 8/2007 | Bhalla et al. |
| 2008/0036015 | A1 | 2/2008 | Anderson et al. |
| 2010/0059815 | A1* | 3/2010 | Grivna ............. H01L 21/76232 |
| | | | 438/270 |
| 2013/0299900 | A1 | 11/2013 | Anderson et al. |
| 2013/0306983 | A1 | 11/2013 | Nakano et al. |
| 2013/0313576 | A1 | 11/2013 | Nakano |
| 2014/0103364 | A1 | 4/2014 | Nakano et al. |
| 2014/0264582 | A1 | 9/2014 | Anderson et al. |
| 2014/0327104 | A1* | 11/2014 | Willmeroth .......... H10D 30/668 |
| | | | 257/493 |
| 2014/0374824 | A1 | 12/2014 | Calafut et al. |
| 2015/0076514 | A1 | 3/2015 | Morin et al. |
| 2015/0287777 | A1 | 10/2015 | Kumagai |
| 2016/0020276 | A1* | 1/2016 | Lu ...................... H10D 84/0151 |
| | | | 257/77 |
| 2016/0225855 | A1 | 8/2016 | Hiyoshi et al. |
| 2016/0322464 | A1 | 11/2016 | Meiser et al. |
| 2016/0351702 | A1 | 12/2016 | Numabe et al. |
| 2017/0018502 | A1* | 1/2017 | Ichinose .......... H01L 21/76802 |
| 2017/0053992 | A1 | 2/2017 | Okada et al. |
| 2018/0047844 | A1 | 2/2018 | Banerjee et al. |
| 2018/0083128 | A1* | 3/2018 | Yokoyama ........... H10D 62/111 |
| 2018/0204838 | A1* | 7/2018 | Hsu ........................ H01L 21/761 |
| 2018/0240906 | A1 | 8/2018 | Tsujimura et al. |
| 2018/0342415 | A1 | 11/2018 | Fujino et al. |
| 2019/0172910 | A1 | 6/2019 | Siemieniec et al. |
| 2019/0296141 | A1 | 9/2019 | Rupp et al. |
| 2019/0341447 | A1 | 11/2019 | Siemieniec et al. |
| 2019/0355815 | A1 | 11/2019 | Basler et al. |
| 2020/0083335 | A1 | 3/2020 | Leomant et al. |
| 2020/0111896 | A1 | 4/2020 | Feil et al. |
| 2020/0194544 | A1 | 6/2020 | Aichinger et al. |
| 2020/0243641 | A1 | 7/2020 | Nakagawa et al. |
| 2021/0159331 | A1 | 5/2021 | Sakai et al. |
| 2021/0376063 | A1 | 12/2021 | Weber et al. |
| 2021/0399091 | A1 | 12/2021 | Cui et al. |
| 2022/0052182 | A1 | 2/2022 | Tutuc et al. |
| 2022/0231162 | A1 | 7/2022 | Peake et al. |

FOREIGN PATENT DOCUMENTS

| | | | |
|---|---|---|---|
| EP | 3460851 | A1 | 3/2019 |
| JP | 2001196602 | A | 7/2001 |
| JP | 2003209263 | A | 7/2003 |
| WO | 2012006261 | A2 | 1/2012 |
| WO | 2012006261 | A3 | 5/2012 |
| WO | 2018048972 | A1 | 3/2018 |

OTHER PUBLICATIONS

Kato, T., et al., "Enhanced Performance of 50 nm Ultra-Narrow-Body Silicon Carbide MOSFETs based on FinFET effect", Proceedings of the 2020 32nd International Symposium on Power Semiconductor Devices and ICs (ISPSD) Sep. 13-18, 2020, Vienna, Austria, Sep. 13, 2020, pp. 110-113.

Udrea, F., et al., "The FinFET effect in Silicon Carbide MOSFETs", The 33rd International Symposium on Power Semiconductor Devices and ICs (ISPSD), May 30-Jun. 3, 2021, Nagoya Full Virtual Conference, May 30, 2021, pp. 75-78.

Wang, Hengyu, et al., "4H-SiC Super-Junction JFET: Design and Experimental Demonstration", IEEE Electron Device Letters, vol. 41, No. 3, Mar. 2020, pp. 445-448.

Bhalla, et al., "The Outlook for SiC Vertical JFET Technology", The 1st IEEE Workshop on Wide Bandgap Power Devices and Applications, Columbus, Oh, USA, doi: 10.1109/WIPDA.2013.6695558., 2013, pp. 40-43.

* cited by examiner

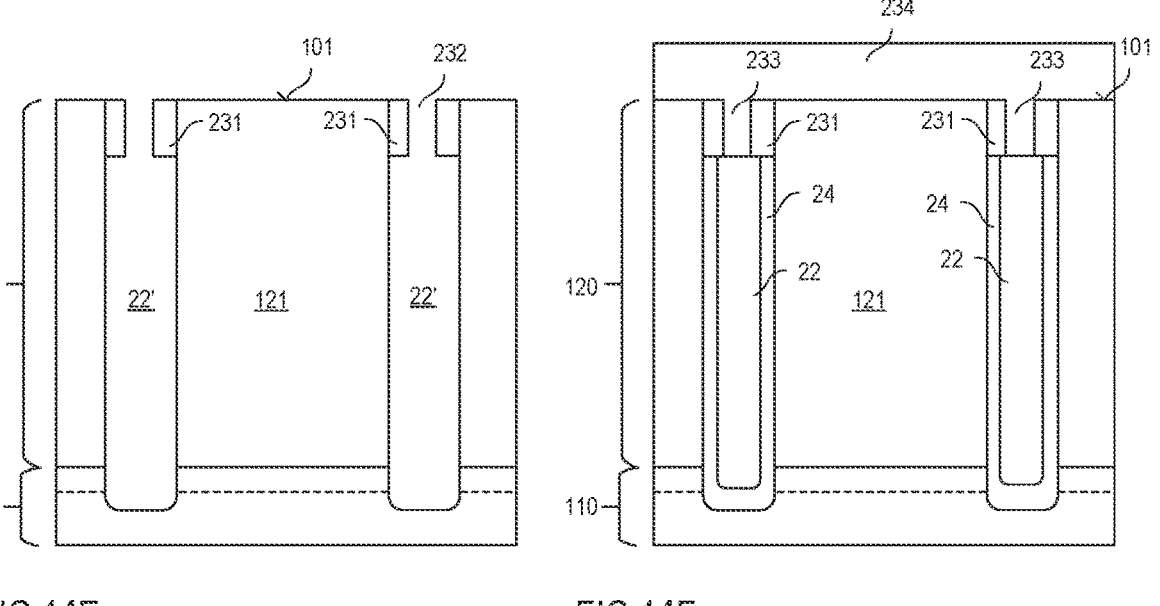
FIG 14E
FIG 14F
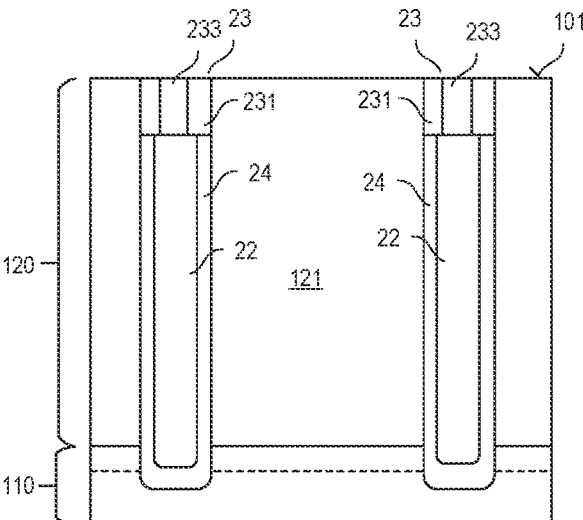
FIG 14G

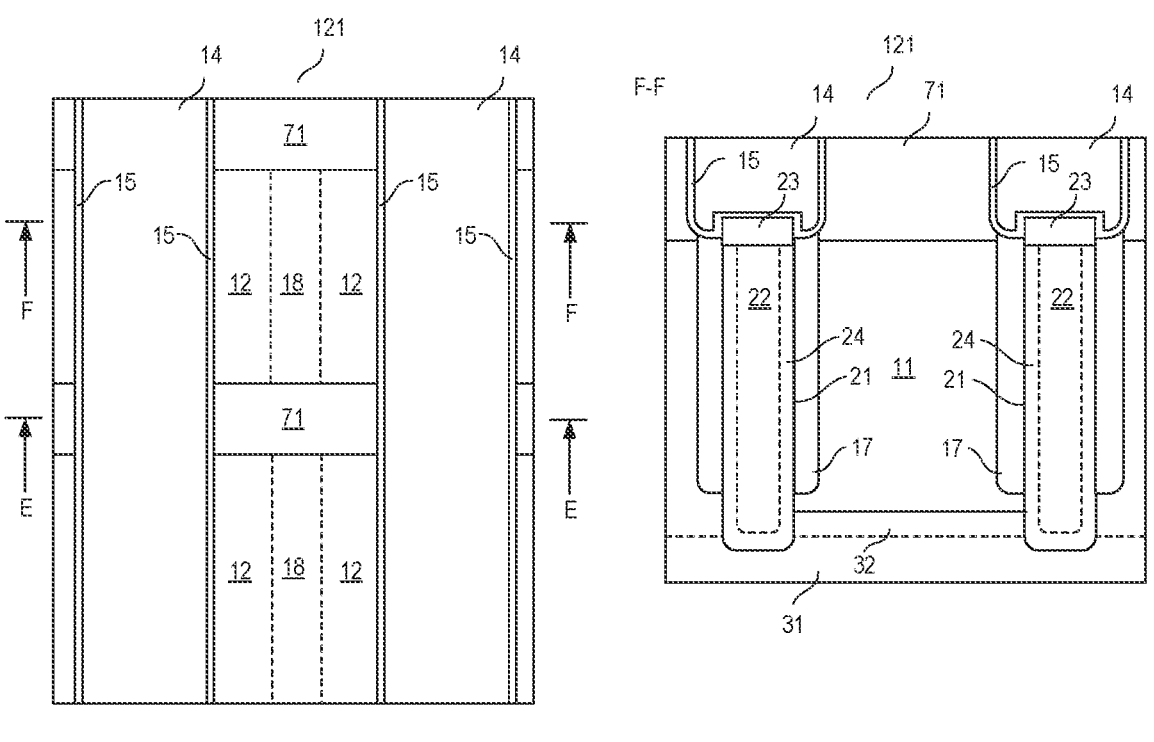
FIG 22A
FIG 22B
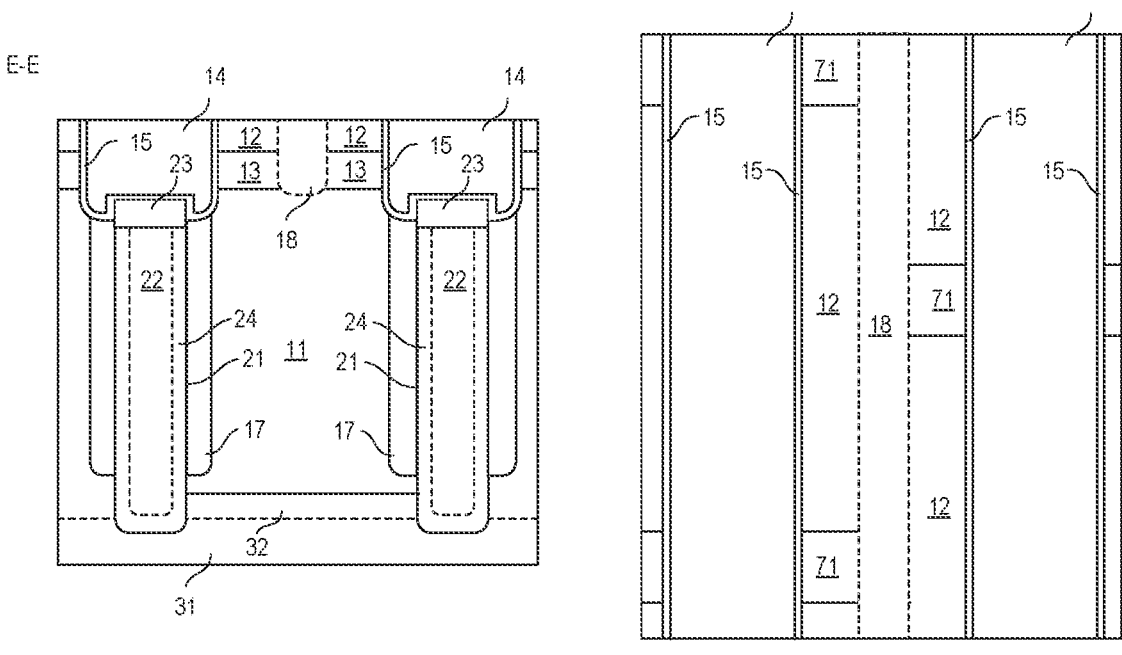
FIG 22C
FIG 23

SEMICONDUCTOR DEVICE AND METHOD OF PRODUCING THEREOF

TECHNICAL FIELD

This disclosure relates in general to a semiconductor device, in particular a semiconductor device that is based on a silicon carbide (SiC) semiconductor body.

BACKGROUND

Because of offering low switching losses at high voltage blocking capabilities semiconductor devices, such as transistor devices, made of Silicon Carbide (SiC) are becoming more and more popular in power electronics applications, such as power conversion and drive applications.

A SiC semiconductor body, however, is prone to bipolar degradation. Bipolar degradation may occur when a recombination of electrons and holes takes place at crystal defects in the semiconductor body of the device. Crystal defects may include basal plane dislocations or stacking faults, for example. The energy associated with the recombination of electrons and holes may cause the crystal defects to further expand in the semiconductor body, so that a large defect region may occur. A large defect region, however, may degrade the device properties, such as increase the on-resistance and increase the leakage current in the transistor device.

Major polytypes of SiC are 4H-SiC, 6H-SiC, and 3C-SiC, wherein SiC of the 4H or 6H polytype is mainly used in the production of semiconductor devices. SiC of the 4H or 6H polytype is thermodynamically metastable. Crystal defects that may occur based on the recombination of electrons and holes include, for example, a local transformation of 4H-SiC or 6H-SiC into 3C-SiC.

There is therefore a need to prevent, or at least reduce bipolar degradation in a SiC based transistor device.

SUMMARY

One example relates to a transistor device. The transistor device includes a SiC semiconductor body that includes a first semiconductor layer and a second semiconductor layer formed on top of the first semiconductor layer, a trench structure extending from a first surface of the semiconductor body through the second semiconductor layer into the first semiconductor layer, a drain region arranged in the first semiconductor layer, and a plurality of transistor cells each coupled between the drain region and a source node. The trench structure subdivides the second semiconductor layer into a plurality of mesa regions, the trench structure includes at least one cavity, and at least one of the plurality of transistor cells is at least partially integrated in each of the mesa regions.

BRIEF DESCRIPTION OF THE FIGURES

Examples are explained below with reference to the drawings. The drawings serve to illustrate certain principles, so that only aspects necessary for understanding these principles are illustrated. The drawings are not to scale. In the drawings the same reference characters denote like features.

FIGS. 14A-14G illustrate one example of a method for forming the trench structure;

FIGS. 22A-22C illustrate different views of a superjunction transistor device formed in accordance with the method according to FIGS. 21A-21D;

FIG. 23 shows a top view of a modification of the transistor device according to FIGS. 22A-22C;

DETAILED DESCRIPTION

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

Figure 1:
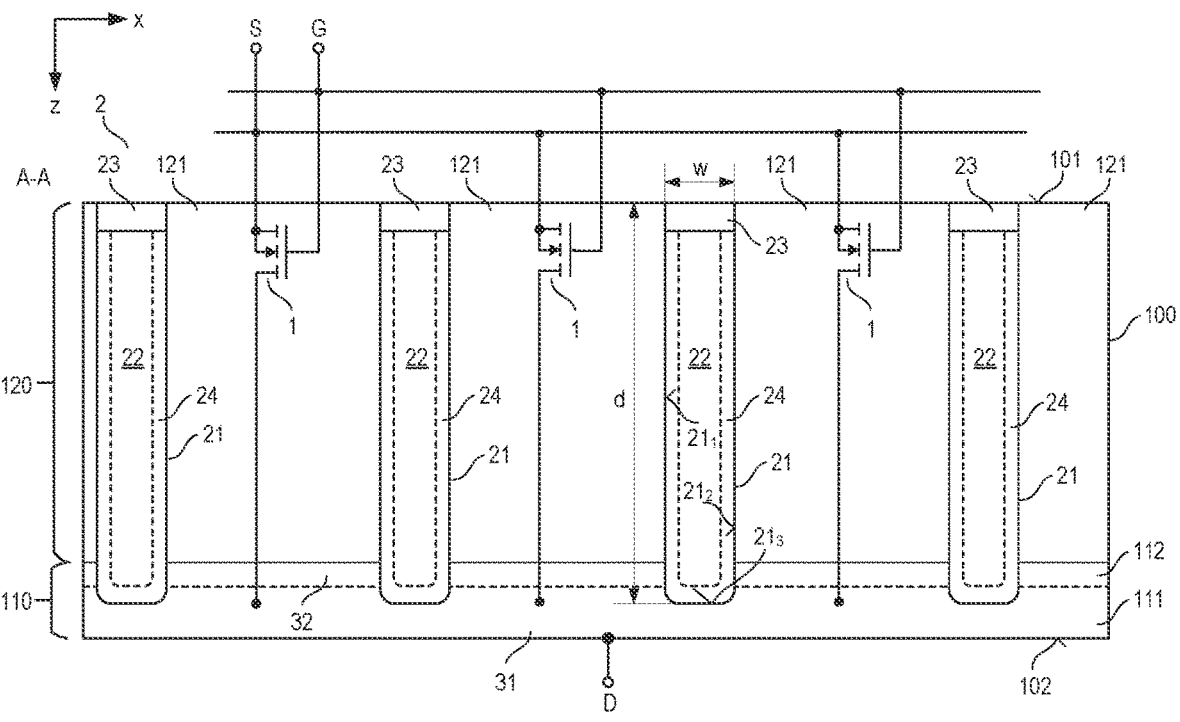
FIG. 1 schematically illustrates a vertical cross sectional view of one example of a semiconductor device that includes a trench structure extending through a second semiconductor layer into a first a semiconductor layer and a plurality of transistor cells integrated in the first semiconductor layer.

FIG. 1 schematically illustrates one example of a semiconductor device, in particular, a transistor device. The transistor device includes a SiC semiconductor body 100. According to one example, the semiconductor body 100 is a 4H-SiC or 6H-SiC semiconductor body 100. The semiconductor body 100 includes a first semiconductor layer 110 and a second semiconductor layer 120 formed on top of the first semiconductor layer 110. The semiconductor body 100 includes a first surface 101 formed by the second semiconductor layer 120 and a second surface 102 formed by the first semiconductor layer 110. FIG. 1 shows a cross sectional view of the semiconductor body 100 in a section plane perpendicular to the first and second surfaces 101, 102. This section plane is also referred to as vertical section plane in the following.

The semiconductor device further includes a trench structure 2 that extends from the first surface 101 of the semiconductor body 100 through the second semiconductor layer 120 into the first semiconductor layer 110 and subdivides the second semiconductor layer 120 into a plurality of mesa regions 121, which may also be referred to as mesa regions. The trench structure 2 "subdividing the second semiconductor layer 120 into the plurality of mesa regions 121" includes that the trench structure 2 is arranged between neighboring ones of the plurality of mesa regions 121. The trench structure 2 not necessarily entirely separates the mesa regions 121 from one another. This is explained herein further below.

Referring to FIG. 1, the transistor device further includes a drain region 31 arranged in the first semiconductor 110, and a plurality of transistor cells 1. Each of the transistor cells 1 is coupled between the drain region 31 and a source node S of the transistor device, wherein the source node S is only schematically illustrated in FIG. 1. At least one of the plurality of transistor cells 1 is at least partially integrated in each of the mesa regions 121. That is, one or more transistor cells 1 may be integrated at least partially in each of the mesa regions 121. In FIG. 1, the one or more transistor cells that are at least partially integrated in each mesa region 121 are represented by the circuit symbol of a transistor. The circuit symbols illustrated in FIG. 1 each represent an n-type enhancement MOSFET. This, however, is only an example and is only for the purpose of illustration. Basically, transistor cells of any type of transistor device may be (at least partially) integrated in the mesa regions 121.

According to one example, the first semiconductor layer 110, in addition to the drain region 31 includes a buffer region 32, wherein the buffer region 32 is arranged between the drain region 31 and the second semiconductor layer 120. According to one example, the drain region 31 is formed by a semiconductor substrate 111 and the buffer region 32 is formed by an epitaxial layer 112 grown on top of the substrate 111. According to one example, a doping concentration of the substrate 111 and, therefore, the drain region 31 is between $1E18$ cm$^{-3}$ and $1E20$ cm$^{-3}$. According to one example, the doping concentration of the buffer region 32 is lower than the doping concentration of the drain region 31. According to one example, the doping concentration of the buffer region 32 is between $1E18$ cm$^{-3}$ and $8E18$ cm$^{-3}$.

According to one example, the second semiconductor layer 120 is an epitaxial layer that is either grown on the substrate 111 (when the buffer region 32 is omitted) or is grown on the epitaxial layer 112 forming the buffer region 32. According to one example, the second semiconductor layer 120 has a basic doping that is formed during the epitaxial growth process. According to one example, a basic doping concentration of the second semiconductor layer 120 is lower than the doping concentration of the drain region 31 and the optional buffer region 32. According to one example, the basic doping concentration is selected from between $1E15$ cm$^{-3}$ and $8E17$ cm$^{-3}$.

The semiconductor body 100 has a vertical direction z, which is a direction in which the first surface 101 and the second surface 102 are spaced apart from each other. According to one example, a thickness of the second semiconductor layer 120, which is the dimension of the second semiconductor layer 120 in the vertical direction z, is between 3 micrometers and 60 micrometers. Referring to the above, the trench structure 2 extends through the second semiconductor layer into the first semiconductor layer 110. According to one example, a vertical dimension of a section of the trench structure that is arranged in the first semiconductor layer 110 is between 500 nanometers and 8 micrometers. "The vertical dimension of the trench structure in the first semiconductor layer 110" is given by a distance between a lower end of the trench structure 2 and an interface between the first semiconductor layer 110 and the second semiconductor layer 120. The "lower end of the trench structure 2" is an end of the trench structure that faces the second surface 102.

The trench structure 2 includes several trenches 21. Each of these trenches 21 is arranged between two neighboring mesa regions 121, and each of the mesa regions 121 is defined by at least two of the trenches 21. Each trench 21 has a depth d, a width w, and a length 1. The depth d is the dimension of the respective trench 21 in the vertical direction z. The width w and the length are dimensions of the respective trench 21 in lateral directions, wherein the width w is smaller than the length. According to one example, the length is at least 10 times, at least 100 times, or at least 1000 times the width w. Furthermore, the width w is the distance between opposite trench sidewalls 211, 212 of each trench 21. In the example shown in FIG. 21, the trenches 21 are drawn to have vertical sidewalls, so that the distance between the sidewalls 211, 212 is essentially the same at each vertical position of trench 21. This, however, is only an example. According to another example, the trenches 21 have beveled sidewalls such that the distance between the sidewalls 211, 212 either decreases or increases towards a trench bottom 213, wherein the trench bottom terminates the respective trench in the vertical direction z. In the following, the width w of the trenches 21 denotes the average distance between the first and second sidewalls 211, 212.

According to one example, the trenches are formed such that an aspect ratio, which is a ratio between the depth d and the width w is selected from between 25:1 and 5:1, in particular between 10:1 and 5:1. According to one example, the trenches are formed such that the width w is between 500 nanometers and 3 micrometers.

In the example shown in FIG. 1, the width of the trenches 21 shown in in this figure is the dimension of the trenches 21 in a first lateral direction x of the semiconductor body 100. The length of each trench 21 is the dimension in a second lateral direction y perpendicular to the first lateral direction x.

Referring to FIG. 1, each of the trenches 21 is closed by a plug 23, so that a cavity 22 is formed in each of the trenches 21 between the respective bottom 213 and the plug 23. According to one example, the plug 23 includes an electrically insulating material, such as a dielectric. According to one example, the plug 23 includes an oxide and/or a nitride. Examples of the oxide include silicon oxide or hafnium oxide. The nitride is silicon nitride, for example.

Referring to FIG. 1, optionally, a dielectric layer 24 (illustrated in dashed lines in FIG. 1) is arranged between the cavity 22 and the semiconductor body 100. According to one example, the dielectric layer includes the same type of material as at least parts of the plug 23. Details on the plug 23 are explained herein further below.

In the transistor device according to FIG. 1 the trench structure 2, which subdivides the second semiconductor layer 120 into a plurality of mesa regions 121 helps to reduce bipolar degradation. Bipolar degradation is associated with a propagation of crystal defects, such as basal plane dislocations or stacking faults, in the crystal of the semiconductor body 100. The trench structure 2 reduces the expansion of such crystal defects as it prevents crystal defects that are generated in one of the mesa regions 121 to propagate into other ones of the mesa regions 121.

According to one example, the trenches 21 are vacuum trenches. That is, a pressure in the cavity 22 is significantly lower than atmospheric pressure. Atmospheric pressure is about 1 bar (≈1013 hPa). According to one example, the pressure in the cavity 22 is less than 1%, less than 0.1%, or even less than 0.01% of atmospheric pressure. Vacuum trenches in accordance with Paschen's law offer a high voltage blocking capability. That is, a vacuum trench may withstand high voltages between different locations along the trench.

In the horizontal plane of the semiconductor body 100, which is a plane that includes the first and second lateral directions x, y and is parallel to the first and second surfaces 101, 102, the trench structure may be implemented in various ways. Different examples are explained with reference to FIGS. 2-4, wherein each of these figures schematically illustrates a top view of at least one section of the semiconductor body 100. For the ease of illustration, only the trench structure 2 is shown in this figures, wherein trenches of the trench structure 2 are represented by bold lines.

Figure 2:
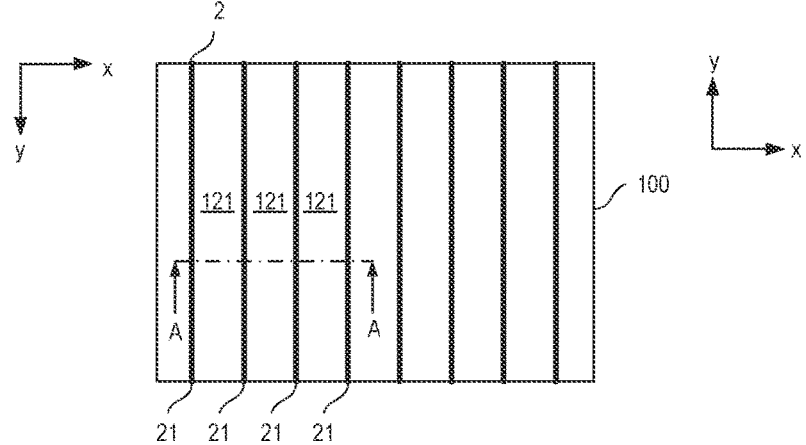
FIGS. 2-4 illustrate top views of semiconductor devices according to different examples.

FIG. 2 illustrates one example of the trench structure 2 in which the trench structure 2 only includes a plurality of trenches 21, wherein the trenches 21 are essentially parallel, wherein the trenches 21 are spaced apart from each other in the first lateral direction x, and wherein longitudinal directions of the trenches corresponds to the second lateral direction y. According to one example, the trenches 21 are formed such that a (shortest) distance between neighboring trenches is between 1 micrometer and 50 micrometers, in particular between 1 micrometer and 30 micrometers. Trenches 21 that are spaced apart from each other in the first lateral direction x are also referred to as first trenches 21A in the following.

Figure 3:
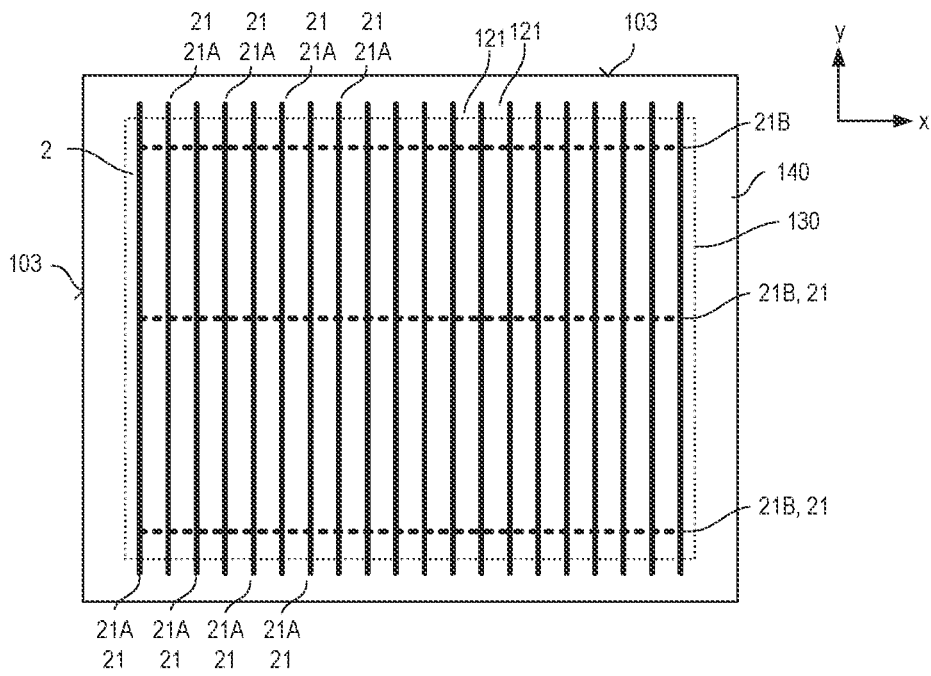

FIG. 3 illustrates a top view of a complete trench structure of the type shown in FIG. 2 and of the complete semiconductor body 100. Referring to FIG. 3, the semiconductor body 100 may include an inner region 130, wherein the inner region is a region in which the transistor cells are integrated. In addition to the inner region 130, the semiconductor body 100 includes an edge region 140, wherein the edge region 140 is arranged between the inner region 130 and an edge surface 103 of the semiconductor body 100. The edge surface 103 terminates the semiconductor body 100 in the first and second lateral directions y, x, and the edge region 140 surrounds the inner region 130 in the horizontal plane.

Referring to FIG. 3, the parallel first trenches 21A may extend entirely across the inner region 130 and into the edge region 140, wherein longitudinal ends of the trenches 21 are spaced apart from the edge surface 103. In this example, the trench structure 2 with the trenches 21 does not entirely separate the mesa regions 121 from one another.

Optionally, the trench structure may additionally include several trenches 21B (illustrated in dashed lines) that longitudinally extend in the first lateral direction x. These trenches, which are referred to as second trenches 21B in the following, cross the first trenches 21A, so that at least some mesa regions 121 are formed that are entirely surrounded by trench sections, sections of two parallel first trenches and sections of two parallel second trenches. Providing the second trenches 21B results in smaller mesa regions, as compared to a scenario in which the trench structure 2 only includes first trenches 21. Smaller mesa regions help to further reduce the risk of bipolar degradation. According to one example, a (shortest) distance between neighboring second trenches is significantly larger than a (shortest) distance between neighboring first trenches. According to one example the distance between neighboring second trenches is at least 10 times the distance between neighboring first trenches.

In the examples shown in FIGS. 2 and 3, the trench structure 2 mainly includes first trenches 21A. "Mainly", as used herein, includes that (a) the trench structure 2 only includes first trenches 21A; or (b) includes second trenches 21B in addition to the first trenches 21A, wherein the number of second trenches 21B is significantly less than the number of first trenches 21A. The number of second trenches 21B is less than 10% of the number of first trenches 21A, for example.

Figure 4:
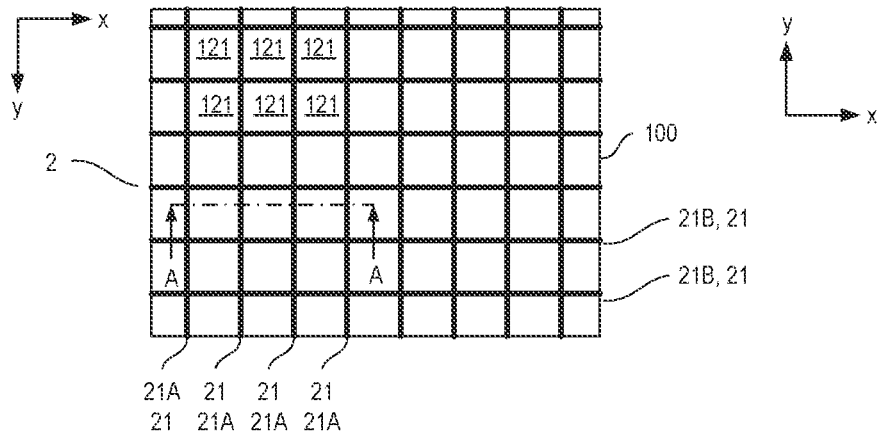

FIG. 4 illustrates a further example of the trench structure 2. In this example the trench structure 2, in addition to the plurality of first trenches 21A, includes a plurality of second trenches 21B that cross the first trenches 21A. The second trenches 21B are essentially parallel. According to one example, a (shortest) distance between two second trenches 21B is between 50% and 200%, in particular between 80% and 120% of the (shortest) distance between two first trenches 21A. In the example shown in FIG. 4, the second trenches 21B are essentially perpendicular to the first trenches 21A. This, however, is only an example. According to another example, angles between the first and second trenches 21A, 21B are between 45° and 90°.

In the example shown in FIG. 4, the first and second trenches 21A, 21B of the trench structure 2 form a grid with a plurality of grid openings, wherein each of the mesa regions 121 is arranged in a respective one of the grid openings. In the example shown in FIG. 3, the grid openings are rectangular. This, however, is only an example. According to another example (not shown) the trenches 21 are formed in such a way that the grid openings have a shape different from the rectangular shape such as a hexagonal shape, for example.

Different examples of the at least one transistor cell integrated in each mesa region 121 are explained with reference to FIGS. 5-11 and 12A-12C. Each of FIGS. 5-11 and 12A-12B illustrates a vertical cross sectional view of a section of the semiconductor body 100, wherein the illustrated section includes one mesa region 121, a section of the first semiconductor layer 110 with the drain region 31 below the mesa region 121, and two trenches adjoining the mesa region 121 in the first lateral direction x.

Throughout the transistor device, the transistor cells 1 may be implemented in the same way. That is, each of the transistor cell 1 may be implemented in accordance with only one of the examples illustrated in FIGS. 5-11 and 12A-12C. This, however, is only an example. It is also possible, to implement the transistor device with different transistor cells. That is, the transistor device may include transistor cells that are implemented in accordance with two or more of the examples illustrated in FIGS. 5-11 and 12A-12C.

Basically, one transistor cell 1 in each of the examples includes a source region 12, a body region 13 adjoining the source region 12, and a drift region 11 adjoining the body region 13. The drift region 11 is arranged between the body region 13 and the drain region 31 and may either adjoin the drain region 31 (when the optional buffer region 32 is omitted), or the buffer region 32. Furthermore, the transistor cell 1 includes a gate electrode 14 that is arranged adjacent to the body region 13 and is dielectrically insulated from the semiconductor body 100 by a gate dielectric 15. The gate electrode 14 is connected to a gate node G, which is only schematically illustrated in the figures. The gate electrode 14 (in a conventional way) serves to control a conducting channel in the body region 13 between the source region 12 and the drift region 11 along the gate dielectric 15, wherein the channel is controlled by a voltage (gate-source voltage) applied between the gate node G and the source node S when the transistor device is in operation.

The transistor cells 1 of the transistor device are connected in parallel. This is achieved by connecting the gate electrodes 14 of the plurality of transistor cells 1 to the gate node G and by connecting the source and body regions 12, 13 of the plurality of transistor cells 1 to the source node S. Furthermore, each of the transistor cells has its drift region 11 connected to the drain region 31, which is connected to the drain node D. Connections between the source and body regions 12, 13 and the source node S, and connections between the gate electrodes 14 and the gate node G are only schematically illustrated in FIGS. 5-11 and 12A-12C. These connections may be implemented in a conventional way using any kind of metallization layers and/or polysilicon layers.

According to one example, the source and body regions 12, 13 are connected to the source node S via trench contacts. Each of these trench contacts includes an electrically conductive material that is located in a trench, wherein the trench extends through, so that the conductive material adjoins the source region 12 into the body region 13. Furthermore, each of the trench contacts is electrically connected to the source node S.

According to one example, the drift region 11, the source region 12, the drain region 31, and the optional buffer region 32 are doped regions of a first doping type (conductivity type), and the body region 13 is a doped region of a second doping type (conductivity type) complementary to the first doping type. The transistor device can be implemented as an n-type device or as a p-type device. In an n-type device, the first doping type (the doping type of the drain region 31, the optional buffer region 32, the drift region 11, and the source region 12) is an n-type and the second doping (the doping type of the body region 13) is a p-type. In a p-type device, the first doping type is a p-type and the second doping type is an n-type. Aluminum (Al) atoms may be used as p-type dopant atoms, and nitrogen (N) or phosphorous atoms may be used as n-type dopant atoms, for example.

Furthermore, the transistor device can be implemented as an enhancement device (normally-off device) or as a depletion device (normally-on device). In an enhancement device, the body region 13 adjoins the gate dielectric 15, as illustrated in FIGS. 5-11 and 12A-12B. A depletion device, in addition to the body region 13 includes a channel region of the first doping type (the same doping type as the source region 12 and the drift region 11), wherein the channel region is arranged between the gate dielectric 15 and the body region 13 and extends from the source region 12 to the drift region 11. Such channel region, however, is not illustrated in the figures.

According to one example, the doping concentration of the source region 12 is selected from between 1E18 cm$^{-3}$ and 1E21 cm$^{-3}$; the doping concentration of the body region 13, for an enhancement device, is selected from between 1E17 cm$^{-3}$ and 1E18 cm$^{-3}$ and, for a depletion device, is selected from between 1E15 cm$^{-3}$ and 1E19 cm$^{-3}$; and the doping concentration of the drift region 11 is selected from between 1E15 cm$^{-3}$ and 8E17 cm$^{-3}$.

The transistor device can be operated in a forward biased mode or a reverse biased mode. In the forward biased mode, a voltage is applied between the drain node D and the source node S such that a pn junction between the drift region 11 and the body region 13 is reverse biased. An n-type transistor device, for example, is operated in the forward biased mode, when a positive voltage is applied between the drain node D and the source node S. In this operating mode, the transistor device conducts dependent on the gate source voltage, wherein the transistor device conducts when the gate source voltage is such that a conducting channel is generated along the gate dielectric 15 between the source region 12 and the drift region 11. Equivalently, the transistor device blocks, when the voltage applied between the drain node D and the source node S forward biases the transistor device and the conducting channel along the gate dielectric 15 is interrupted.

In the reverse biased mode, a polarity of the voltage between the drain node D and the source node S is such that the pn-junction between the body region 13 and the drift region 11 is forward biased. In this operating mode, the transistor device conducts independent of the gate-source voltage. Furthermore, in the reverse biased mode, the transistor device is in a bipolar mode, which is an operating mode in which electrons and holes occur in the drift region 11. In this operating mode, the body region 13 injects one of electrons and holes into the drift region 11, and the drain region 31 injects the other ones of electrons and holes into the drift region 11.

In the forward biased mode, when the transistor device is in an off-state, that is, when the conducting channel along the gate dielectric 15 is interrupted, a space charge region (depletion region) expands in the drift region 11 beginning at the pn-junction between the drift region 11 and the body region 13. The higher the voltage that is applied between the drain node D and the source node S, the farther this depletion region expands towards the drain region 31.

According to one example, the trenches 21 shown in FIGS. 5-11 and 12A-12B are first trenches and the source regions 12 and body regions 13 are elongated regions that run parallel to the trenches 21. The source and body regions 12, 13 may be interrupted by optional second trenches crossing the first trenches. In the latter case, the source regions 12 (a) may be implemented as elongated regions that extend along the first trenches and are interrupted by the second trenches, or (b) may be implemented as ring-shaped regions (in the horizontal plane) that each have first sections extending along first trenches and second sections extending along second trenches.

Figure 5:
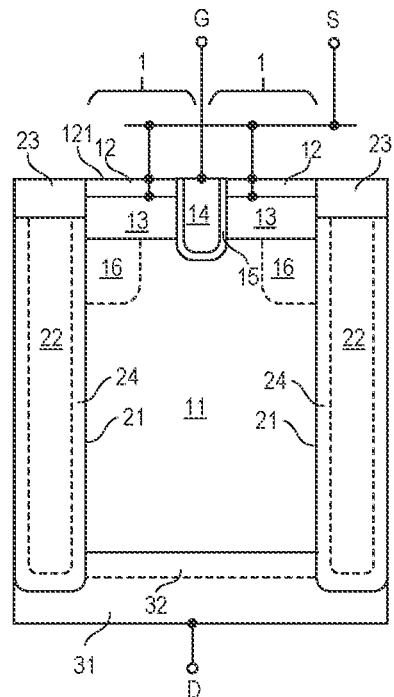
FIGS. 5-7 illustrate different examples of transistor cells.

In the example shown in FIG. 5, two transistor cells 1 are integrated in one mesa region 121. In this example, the drift regions 11 of the transistor cells 1 are formed by one contiguous semiconductor region. According to one example, the drift region 11 is a semiconductor region having the basic doping concentration of the mesa region 121. Furthermore, in the example shown in FIG. 5, the gate electrodes 14 of the two transistor cells 1 are formed by one electrode, and the and gate dielectrics 15 of the two transistor cells 1 are formed by one dielectric layer adjoining the common gate electrode 14. The gate electrode 14 may include a metal or doped polysilicon, for example.

In the example shown in FIG. 5, the gate dielectric 14 is arranged in a trench that extends from the first surface 101 into the semiconductor body. This, however, is only an example. According to another example the gate electrode 14 is implemented as a planar gate electrode that is arranged on top of the first surface 101. In this example, the drift region 11 includes a drift region sections that extends to the first surface 101. Transistor cells with a planar gate electrode are commonly known, so that no further explanation is required in this regard.

Referring to the above, in the forward biased mode, when the transistor device is in an off-state, that is, when the conducting channel along the gate dielectric 15 is interrupted, a space charge region (depletion region) expands in the drift region 11 beginning at the pn-junction between the drift region 11 and the body region 13. The higher the voltage that is applied between the drain node D and the source node S, the farther this depletion region expands towards the drain region 31. The expanding depletion region is associated with an electric field.

Optionally, in order to protect the gate dielectric 15 against high dielectric fields, the transistor device furthermore includes semiconductor regions 16 of a doping type complementary to the doping type of the drift region 11, wherein these semiconductor regions 16 are connected to the source node S. The semiconductor regions 16 are spaced apart from each other in the first lateral direction x and form a JFET (junction field-effect transistor) with a section of the drift region 11 arranged between the two semiconductor regions 16. The semiconductor regions 16 are also referred to as JFET regions in the following.

When the transistor device is forward biased and in the off-state, the depletion region also expands beginning at the pn-junctions between the JFET regions 16 and the drift region 11, wherein a doping concentration of the JFET regions 16 and the distance between the JFET regions 16 in the first lateral direction x are adapted to one another such that the drift region section arranged between the JFET regions 16 is completely depleted when the drain-source voltage reaches a predefined voltage level. The predefined voltage level is lower than a voltage level that may cause electric fields that are suitable to damage the gate dielectric 15. In this way, the JFET regions 16 protect the gate dielectric 15 against high electric fields.

FIG. 5 shows an example in which two transistor cells 1 are integrated in one mesa region 121. This, however, is only an example. Basically, an arbitrary number of transistor cells 1 may be integrated in each of the mesa regions 121. Integrating more than two transistor cells 1 in one mesa region 121 may be achieved by forming more than one gate electrode 14 in each mesa region 121, wherein each gate electrode is adjacent a respective body region 13.

Figure 6:
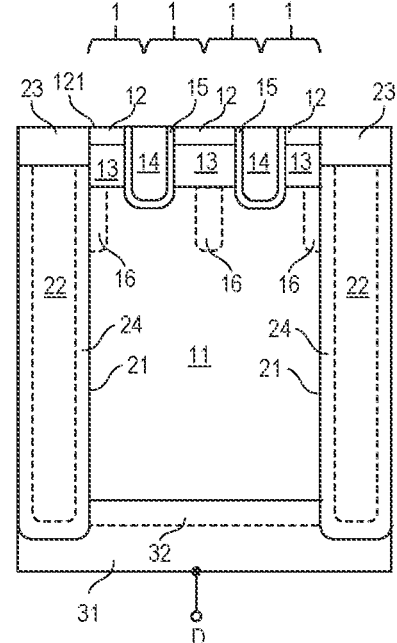

FIG. 6 illustrates an example in which two gate electrodes 14 are formed in the mesa region 121. Each of these gate electrodes 14 forms the gate electrode of two transistor cells 1, so that in this example four transistor cells are integrated in the mesa region 121. Each of the gate electrodes 14 is arranged adjacent to a body region 13 of a respective transistor cell 1, wherein the body regions of two transistor cells 1 may be formed by one common semiconductor region.

Figure 7:
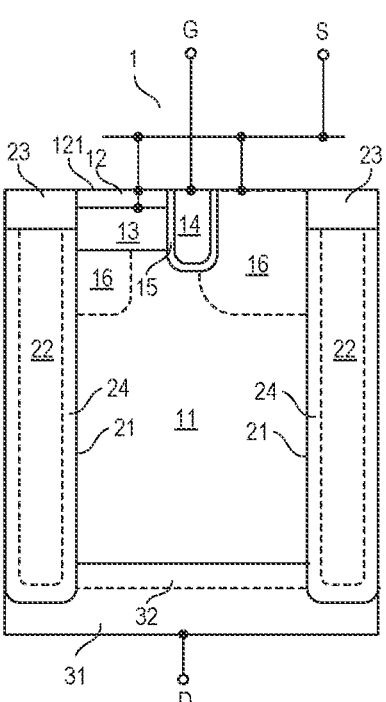

FIG. 7 illustrates a modification of the example shown in FIG. 5. In the example shown in FIG. 7, only one transistor cell is integrated in the mesa region 121. For this, only one body region 13 and only one source region 12 is arranged adjacent to the gate electrode 14 and is dielectrically insulated from the gate electrode 14 by the gate dielectric 15. In this example, one of the optional JFET regions 16 may be arranged adjacent to the gate electrode 14 and adjoin the gate dielectric 15 at a side of the gate trench that is opposite to the side where the source region 12 and the body region 13 is arranged. The "gate trench" is the trench in which the gate electrode 14 and the gate dielectric 15 are located.

In the example shown in FIG. 7, the gate trench is drawn to have vertical sidewalls. This, however, is only an example. According to another example (not illustrated) sidewalls of the gate trench are beveled. In this example, the opposite sidewalls of the gate trench may correspond to different crystal planes of the SiC semiconductor body. In a SiC semiconductor body, there are crystal planes in which charge carriers, such as electrons in an n-type device, have a higher mobility than in other crystal planes. This higher charge carrier mobility may result in a lower channel resistance when the channel region that is formed along the gate dielectric 15 is located in such crystal plane offering a higher charge carrier mobility. Such crystal planes include a-planes or m-planes, for example. According to one example, in an arrangement of the type shown in FIG. 7, an interface between the body region 13 and the gate dielectric 15 is in a crystal plane offering a high carrier mobility, such as an a-plane or m-plane.

According to one example, the transistor cells 1 are superjunction transistor cells. In this example, each of the transistor cells 1 includes at least one compensation region 17 of the second doping type, that is, a doping type complementary to the doping type of the drift region 11. The compensation region 17 adjoins the drift region 11 and is connected to the source node S.

Figure 8:
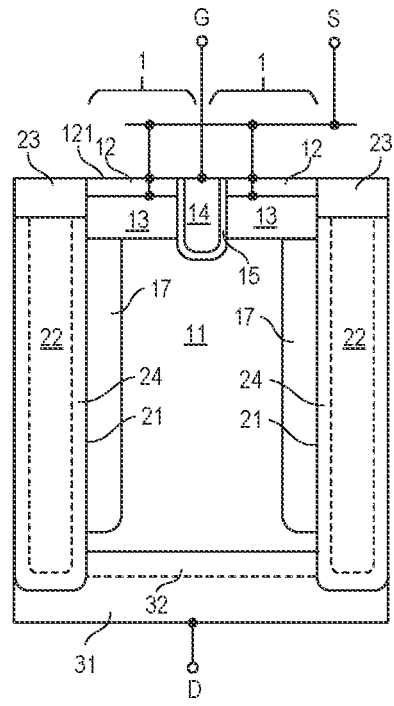
FIGS. 8-10 illustrate different examples of superjunction transistor cells.

FIG. 8 illustrates two transistor cells that are implemented as superjunction transistor cells. The transistor cells 1 according to FIG. 8 are based on the transistor cells illustrated in FIG. 5, wherein each of the transistor cells 1 includes a compensation region 17 of the second doping type. The compensation region 17 adjoins the body region 11 and is connected to the source node S. For connecting the compensation regions 17 to the source node S, the compensation regions 17 may adjoin the body regions 13 (as illustrated). Referring to FIG. 8, the compensation regions 17 extend in the vertical direction z. According to one example, a dimension of the compensation regions 17 in the vertical direction z, is at least 50%, at least 70%, or at least 90% of the thickness of the second semiconductor layer 120. The compensation regions 17 may be implemented such that they are spaced apart from the drain region 31 or the optional buffer region 32 in the vertical direction z, or such that they adjoin the drain region 31 or the optional buffer region 32. Dimensions of the compensation regions 17 in the first lateral direction x are between 100 nanometers and 1 micrometer, in particular from between 100 nanometers and 300 nanometers, for example.

Figure 9:
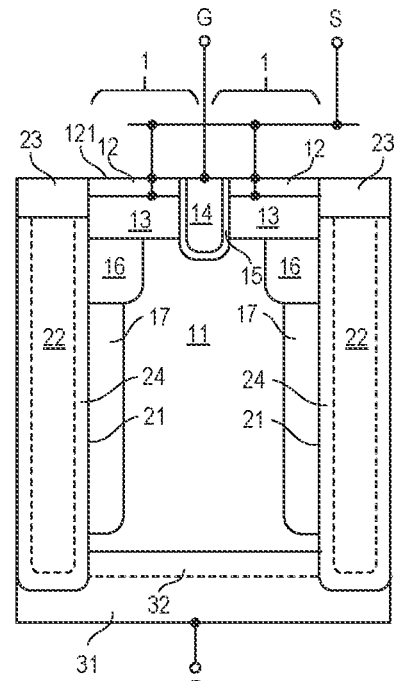

FIG. 9 shows a modification of the arrangement shown in FIG. 8. In the example shown in FIG. 9, the transistor device, in addition to the body regions 13 and the compensation regions 17 includes JFET regions 16. These JFET regions 16 are arranged between the body regions 13 and the compensation regions 17 and adjoin the body regions 13 and the compensation regions 17.

Figure 10:
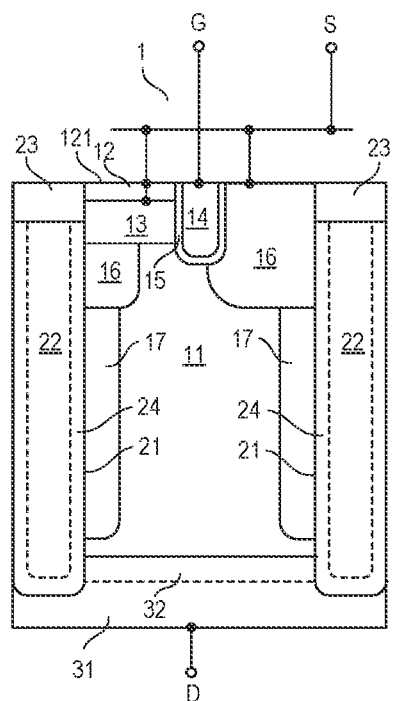

FIG. 10 illustrates one example of a superjunction transistor cell 1 that is based on the transistor cell shown in FIG. 7. In this example, the superjunction transistor cell 1 includes two compensation regions 17, wherein each of these compensation regions 17 extends along one of the two trenches 21, 22 and is connected to the source node S. Optionally, the superjunction transistor cells includes JFET regions 16. In this example, the superjunction transistor cells 17 may be connected to the source node S via the JFET regions 16.

Figure 11:
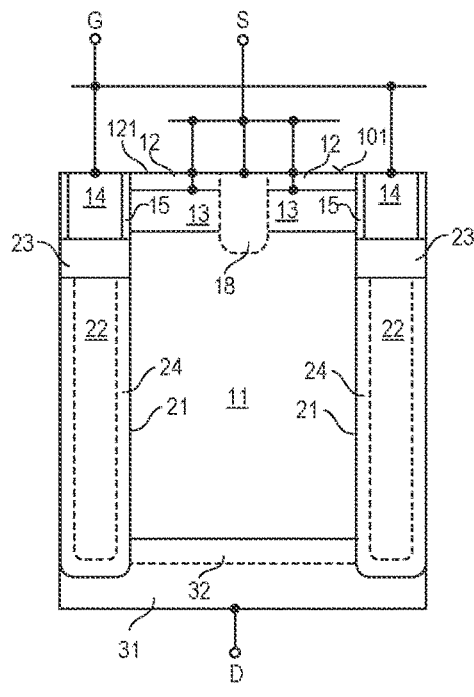
FIGS. 11 and 12A-12C illustrate different examples of transistor cells (MOSFET cells) that each include a gate electrode arranged in a respective trench of the trench structure.

According to another example illustrated in FIG. 11, the gate electrodes 14 are arranged in the trenches 21 of the trench structure 2. In this case, the gate electrodes 14 are arranged above the plug 23 that closes the cavity 22. The source and body regions 12, 13 of the transistor cells 1 are formed in the mesa region 121 one above the other, wherein both the source region 12 and the body region 13 extend, in the first lateral direction x, to the trench 21 that includes the respective gate electrode 14 and gate dielectric 15. In this example, JFET regions that protect the gate dielectric 15 may be omitted, which may help to reduce the on-resistance of the transistor device. The "on-resistance" is the electrical resistance of the transistor device between the drain node D and the source node S in an on-state, that is, when a conducting channel is generated along the gate dielectrics 15 in the body region 13. Providing the JFET regions 16 locally reduces the cross sectional area of the drift region 11 and, therefore, increases the on-resistance. Thus, omitting the JFET regions 16 may help to reduce the on-resistance.

However, omitting JFET regions in the device according to FIG. 11 is only an example. It is also possible to provide JFET regions that are laterally spaced apart from the gate dielectric 14 and connected to the source node S. According to one example, each JFET region (not shown in FIG. 11) adjoins a respective body regions 13.

In the example shown in FIG. 11, arranging the gate electrodes 14 in the trenches 21 of the trench structure 2, wherein these trenches extend from the first surface 101 into the first semiconductor layer 110, helps to prevent high electric field at the gate dielectric 15. High electric fields occur, in particular, when the gate dielectric 15 has a curved structure. Curvatures of the gate dielectric 15 are avoided in the example shown in FIG. 11. Furthermore, bottoms of the trenches 21 are located in the first semiconductor layer 110. During operation of the transistor device, an electrical potential of the first semiconductor layer 110 essentially equals drain potential, so that electric fields along the trenched bottoms are avoided.

Figure 12A:
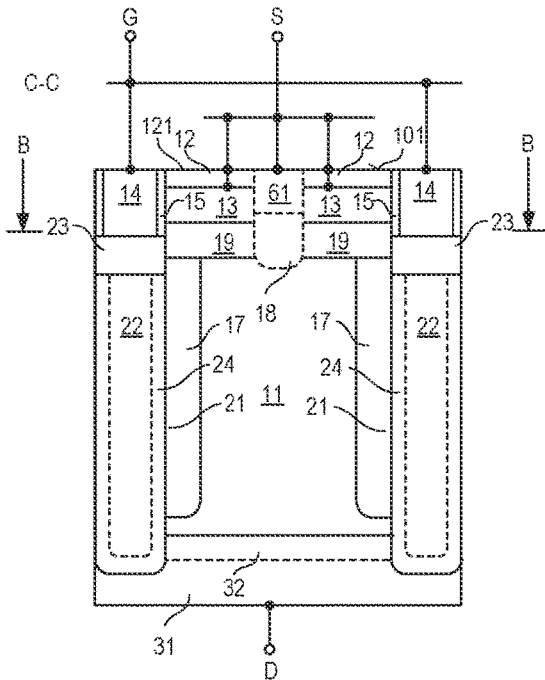
Figure 12B:
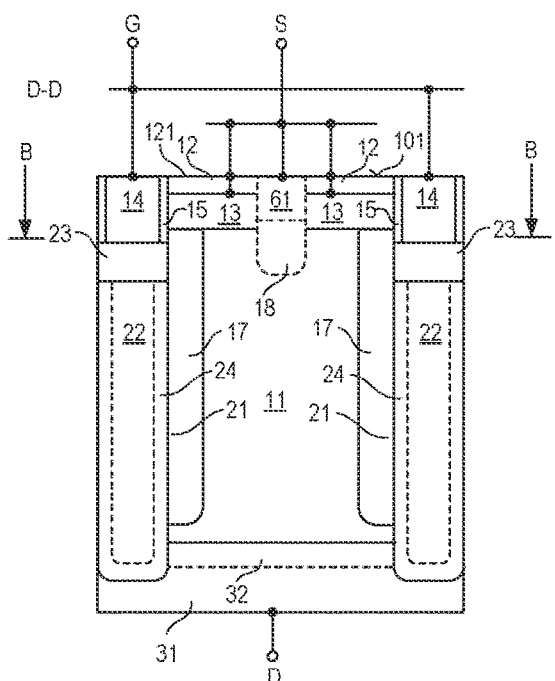
Figure 12C:
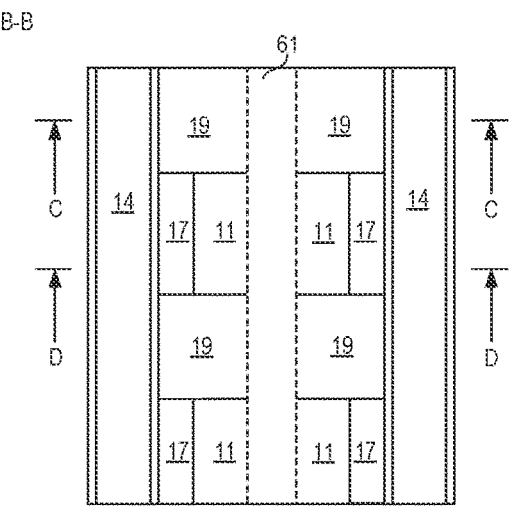

FIGS. 12A-12C illustrate transistor cells 1 of the type shown in FIG. 11 that are implemented as superjunction transistor cells, wherein the compensation regions 17 extend along the trenches 2. In this example, each transistor cell 1 includes a doped region 19 of the first doping type, which is referred to as current spreading region in the following. The current spreading region 19, in the first lateral direction x extends from the gate dielectric 15 to the drift region 11, so that in the on-state a current can flow from the source region 12 along the gate dielectric 15 in the body region 13 and the current spreading region 19 to the drift region 11. Referring to FIG. 12C, which shows a horizontal sectional view in a section plane that cuts through the current spreading layer 19, the current spreading layer 19 includes several sections that are spaced apart from each other in the second lateral direction y. In those sections of the section layer 121 where the current spreading layer 19 is omitted, the compensation regions 17 extend to the body region 13 (as illustrated in FIG. 12B), so that the compensation regions 17, via the body regions 13, are connected to the source node S.

Optionally, in each of these examples illustrated in FIGS. 11 and 12A-12C, the transistor device further includes a doped region 18 of the second doping type, wherein this semiconductor region 18 is connected to the source node S and extends through the source region 12 and the body region 13 into the drift region 11. According to one example, this semiconductor region 18, which is also referred to as breakthrough region in the following, is located in the middle between the two trenches 21. This breakthrough region 18 defines the position at which a breakdown occurs when the drain-source voltage reaches a critical voltage level. The critical voltage level is a voltage level at which the electric field reaches a critical value, which is a value at which an avalanche breakdown occurs. The breakthrough region 18 defines the position at which such breakdown occurs when the drain-source voltage reaches the critical voltage level. By arranging the breakthrough region 18 in the middle between the trenches 21 the position at which the breakdown occurs is spaced apart from the gate dielectrics 15 so that the gate dielectrics 15 are protected against the injection of hot charge carriers, for example.

According to one example, the breakthrough region 18 extends from the first surface 101 through the source and body regions 12, 13 into the drift region. This example is illustrated in FIG. 11.

According to another example, the breakthrough region 18 adjoins a trench contact (contact plug) 61 that extends from the first surface 101 through the source region 12 and the body region 13 and is electrically connected to the source node S. In this example, which is illustrated in FIGS. 12A-12C, the source region 12 and the contact region 13 are connected to the source node S via the trench contact 61, which includes an electrically conductive material such as, for example, a metal and/or a silicide. The breakthrough region 18 adjoins the trench electrode 61 and extends into the drift region 11. Forming the breakthrough region 18 may include forming a trench that is configured to accommodate the trench electrode 61; implanting dopant atoms via a bottom of the trench into the body region 13 and the drift region 11 to form the breakthrough region 18; and forming the trench electrode 61 in the trench. Forming the breakthrough region 18 may further include an annealing process to activate the implanted dopant atoms. This annealing process may be the same annealing process that activates dopant atoms in any of the other active regions such as, for example, source, body or compensation regions 12, 13, 17.

In the examples explained with reference to FIGS. 5-11 and 12A-12C, each of the transistor cells 1 includes a gate electrode 14 (wherein the gate electrodes of two or more transistor cells may be formed by one electrode) that is dielectrically insulated from the source and body regions 12, 13 by a gate dielectric. Transistor cells 1 of this type are MOSFET cells and the resulting transistor device is a MOSFET. However, implementing the transistor device as a MOSFET is only an example. According to another example, the transistor device is a JFET.

Figure 13:
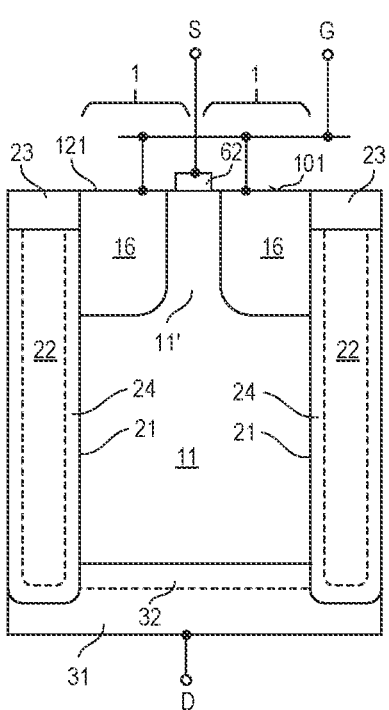
FIG. 13 illustrates JFET cells according to one example.

One example of a JFET is illustrated in FIG. 13. More specifically, FIG. 13 illustrates a vertical cross sectional view of two transistor cells of a JFET. These transistor cells 1 are based on the transistor cells 1 according to FIG. 9 and are different from the transistor cells according to FIG. 5 in that the gate electrode 14, the gate dielectric 15, and the source and body regions 12, 13 are omitted and in that the JFET regions 16 are connected to the gate node G. These JFET regions 16 form gate regions of the JFET. Furthermore, the drift region 11 includes a section 11', which extends between the JFET regions 16 towards the first surface 101 and is connected to a contact electrode 62. This section 11' of the drift region 11 may be referred to as channel region. The contact electrode 62 that is connected to the channel region includes an electrically conductive material such as a metal, a metal alloy, or a silicide and is connected to the source node S.

FIGS. 14A-14G illustrate one example of a method for forming the trench structure 2. More specifically, FIGS. 14A-14G illustrate one example of a method for forming trenches 21 that each include a cavity 22 and a plug 23 closing the cavity 22, wherein each of FIGS. 14A-14G shows a vertical cross sectional view of one section of the semiconductor body 100 in which two of these trenches are formed.

Figures 14A, 14B, 14C, 14D:
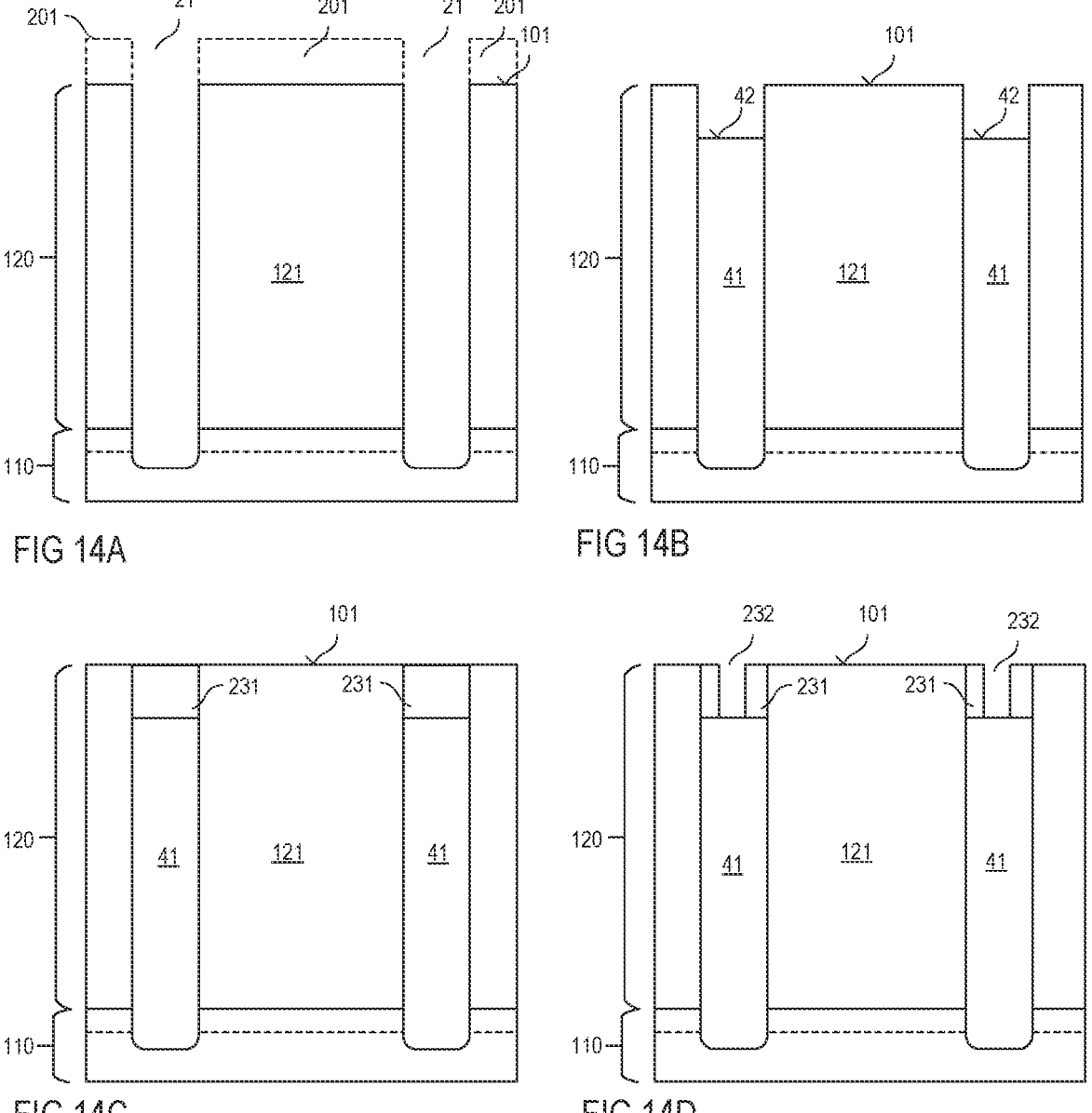

Referring to FIG. 14A the method includes forming the trenches 21 in the semiconductor body 100 such that the trenches 21 extend from the first surface 101 through the second semiconductor layer 120 into the first semiconductor layer 110. Referring to the above, the first semiconductor layer 110 may include a first sublayer 111 forming the drain region 31 of the finished transistor device and an optional second sublayer 112 forming the buffer region 32 of the finished transistor device. The first semiconductor layer 110 may include a doped semiconductor substrate that forms the first sublayer 111. The optional second sublayer 112 is an epitaxial layer grown on the substrate, for example. According to one example, the second sublayer 112 is in-situ doped during the epitaxial growth process. According to one example, the second semiconductor layer 120 is an epitaxial layer that is either grown on the substrate forming the drain region 31 or on the epitaxial layer forming the buffer region 32. According to one example, the second semiconductor layer 120 is in-situ doped during the epitaxial growth process to provide a basic doping of the second semiconductor layer 120 and, therefore the mesa regions 121.

Forming the trenches 21 may include an etching process. According to one example, the etching process includes forming an etch mask 201 (illustrated in dashed lines in FIG. 14A) on top of the first surface 101, wherein the etch mask 201 includes openings in which the first surface 101 of the semiconductor body 100 is not covered. The method further includes etching the semiconductor body 100 in those sections in which the etch mask 201 does not cover the first surface 101. According to one example, the etching process is an anisotropic etching process. A duration of the etching process is adjusted such that the etching process ends when the trenches 21 have been etched down into the first semiconductor layer 110. Referring to the above, the thickness of the second semiconductor layer 120 is between 3 micrometers and 60 micrometers, for example. The aspect ratio of the trenches 21 is between 5:1 and 25:1, for example.

Referring to FIG. 14B, the method further includes partially filling the trenches 21 with a sacrificial plug 41. According to one example, the sacrificial plug 41 includes a sacrificial material that can be etched selectively relative to the semiconductor body 100. According to one example, the sacrificial material includes polysilicon or an oxide. The oxide is silicon oxide (SiO$_2$), for example, and may be formed based on depositing TEOS (tetraethoxysilane). "Partially filling" the trenches 21 by the sacrificial plug 41, includes filling the trenches 21 such that the sacrificial plug 41 does not completely fill the trenches 21. That is, an upper surface 42 of the sacrificial plug 41 is spaced apart from the first surface 101 in the vertical direction z, wherein a distance between the surface 42 of the sacrificial material 41 and the first surface 101 of the semiconductor body 100 defines a thickness of the plug that closes the cavity in the finished trench structure. This is explained in the following.

Referring to FIG. 14C, the method further includes filling a gap (residual trench) between the sacrificial plug 41 and the first surface 101 with a first plug 231. The plug 23 of the finished device is formed based on the first plug 231 according to FIG. 14C. This is explained in detail herein further below. The first plug 231 includes an oxide, such as silicon oxide (SiO$_2$), for example.

Referring to FIG. 14D, the method further includes forming an opening 232 in each first plug 231, wherein the opening 232 extends through the first plug 231 down to the sacrificial plug 41. Forming the opening 232 may include an etching process using an etch mask (not illustrated in FIG. 14D).

Referring to FIG. 14E, the method further includes removing the sacrificial material 41 via the openings 232 formed in the first plugs 231. Removing the sacrificial material 41 may include an isotropic etching process in which the sacrificial material 41 is removed selectively relative to the semiconductor body 100 and the plug 231, so that voids 22' are formed in the trenches 21 below the plugs 231. If, for example, the sacrificial plug 41 includes polysilicon TMAH (tetramethylammonium hydroxide) may be used to selectively remove the sacrificial plug 41.

Referring to FIGS. 14F and 14G, the method further includes closing the openings 232 in the plugs 231 so as to form the plugs 23 of the finished transistor device. According to one example, closing the openings 232 of the plugs 231 takes place in a low pressure (vacuum) atmosphere, so that a pressure in the voids 22 after closing the voids 22 by the plugs 23 essentially equals the ambient pressure in the process of closing the plugs. This pressure may be significantly lower than atmospheric pressure. According to one example, closing the openings 232 in the plugs 231 includes a high density plasma process (HDP process) in which plug material 233, such as an oxide, is deposited.

Referring to FIG. 14F, the duration of this process is selected such that the openings 232 in the first plugs 231 are completely closed by a plug material 233, wherein the plug material 233 closing the openings 232 and the first plugs 231 from the plugs 23 of the finished trench structure. In the process according to FIG. 14F, plug material is deposited on each surface of the structure according to FIG. 14E, so that plug material is also deposited on sidewalls and a bottom of the trenches 21 before the openings 232 are closed. The plug material deposited in the trenches 21 forms the optional dielectric layer 24 explained herein before. Due to the nature of the process, the dielectric layer 24 may be thicker at the bottom of each trench 21 than along the sidewalls.

According to one example, an oxide layer (not shown) is formed on the sidewalls and the bottom of the trenches 21 before initiating the process of closing the openings 232, such as an HDP process. Forming the oxide layer may include a thermal oxidation process. The oxide layer may help to reduce surface charges at the interface between the trenches 21 and the adjoining semiconductor material of the semiconductor body 100.

Referring to FIG. 14F, the plug material may also be deposited on the first surface 101 of the semiconductor body 100. This plug material 234 deposited on the first surface 101 may be removed in a planarizing process, wherein the result of this process is illustrated in FIG. 14G. The planarizing process includes a chemical and/or mechanical polishing process, for example.

Figures 15A, 15B, 15C:
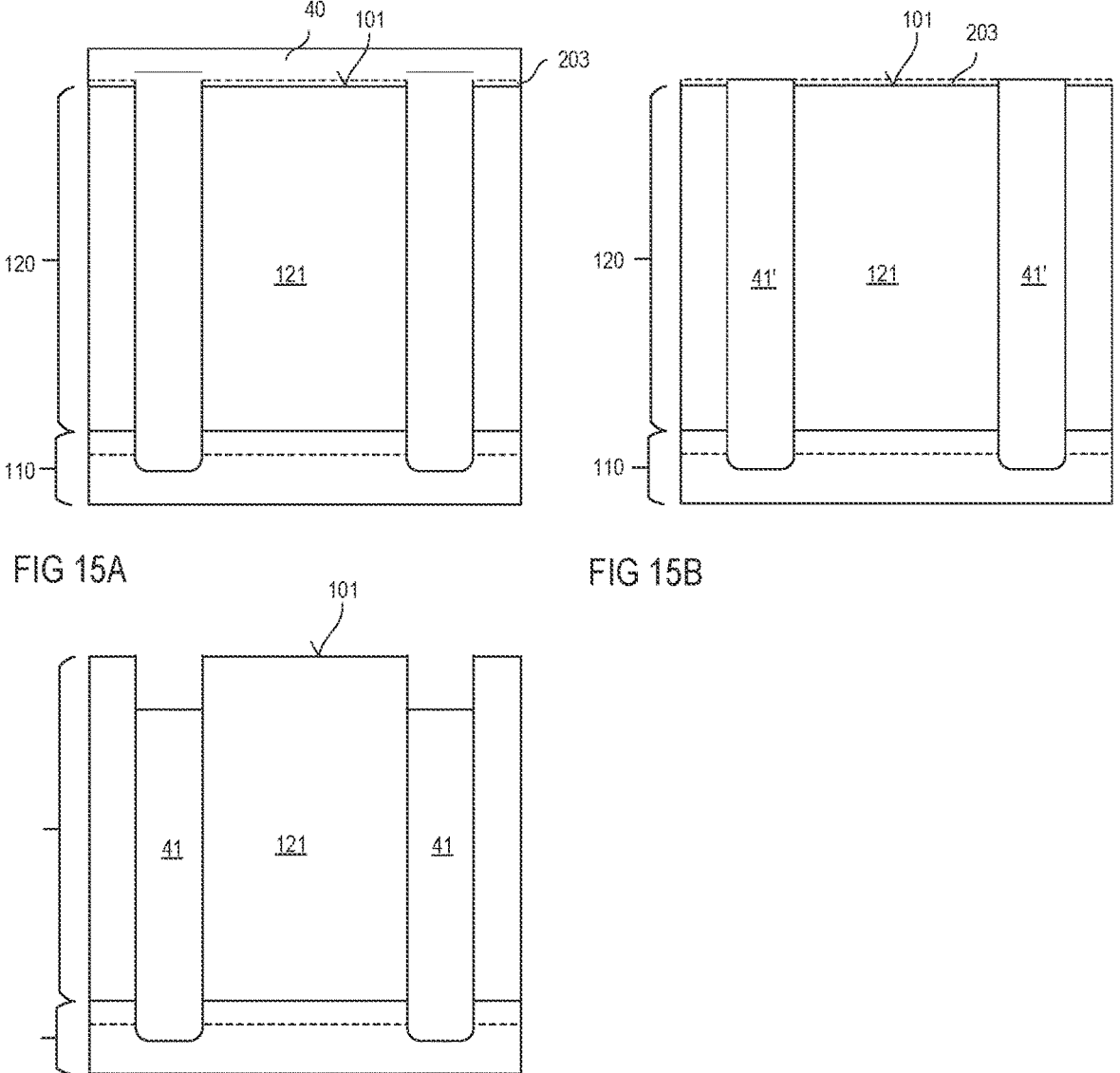
FIGS. 15A-15C illustrate one example of a method for forming a sacrificial plug in the method according to FIGS. 14A-14G.

FIGS. 15A-15C illustrate one example of a method for forming the sacrificial plug 41 in the each trench 21. Referring to FIG. 15A, this method includes completely filling the trenches 21 and covering the first surface 101 of the semiconductor body 100 by a sacrificial material 40. Referring to FIG. 15B, the method furthermore includes removing the sacrificial material 40 down to the first surface 101 in a first removal process. This removal process includes a chemical and/or mechanical polishing process, for example. At the end of the first removal process, the trenches 21 are completely filled by preliminary sacrificial plugs 41'.

Optionally, the method includes forming a stop layer 203 (illustrated in dashed lines) on top of the mesa regions 121 and removing the sacrificial material 40 down to the stop layer 203 in the removal process. The stop layer may be deposited on the first surface 101 before forming the etch mask (201 in FIG. 14A) and may be etched in the same process in which the trenches 21 are formed so that the stop layer 203 remains on top of the mesa regions 121. The stop layer 203 is a nitride layer, for example.

Referring to FIG. 15C, the method further includes partially removing the preliminary sacrificial plugs 41' to form the sacrificial plugs 41. Partially removing the preliminary sacrificial plugs 41' may include an etching process that selectively etches the sacrificial material relative to the semiconductor body 100. The optional stop layer 203 may be removed before or after forming the sacrificial plugs 41 based on the preliminary sacrificial plugs 41'.

Figures 16A, 16B:
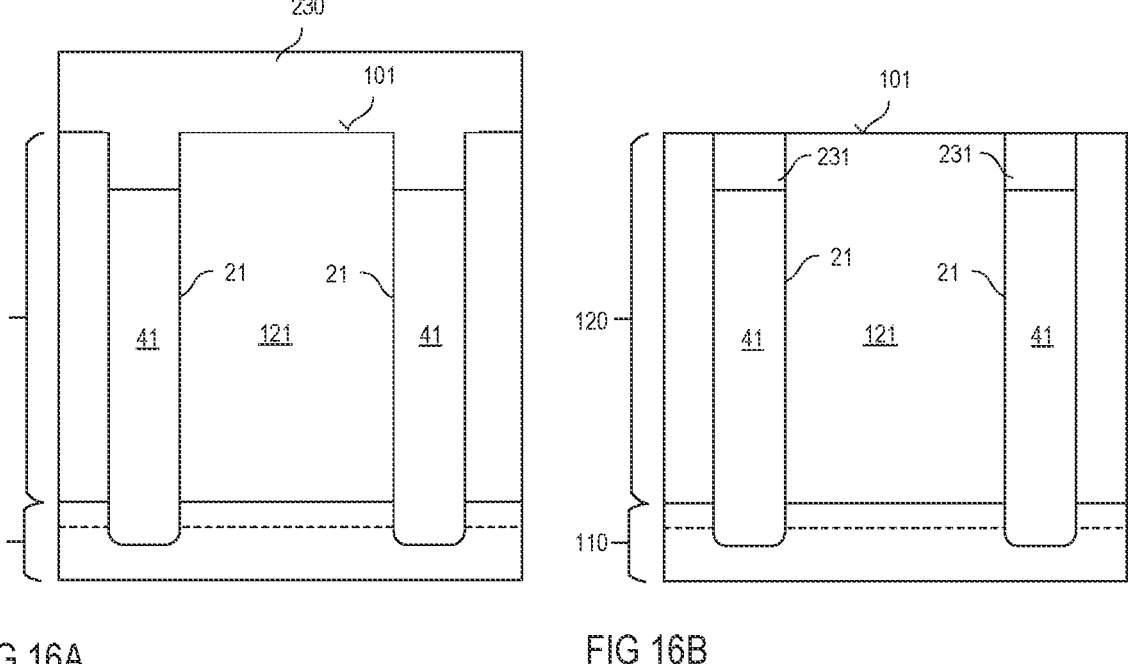
FIGS. 16A-16B illustrate one example of a method for forming a plug on top of the sacrificial plug in the method according to FIGS. 14A-14G.

FIGS. 16A and 16B illustrate one example of a method for forming the first plugs 231 on top of the sacrificial material 41 shown in FIG. 14C. Referring to FIG. 16A, this method includes depositing a plug material layer 230 such that the plug material layer fills the gaps (the residual trenches) on top of the sacrificial material 41 and covers the first surface 101 of the semiconductor body 100. Forming the plug material layer 230 may include a deposition process.

Referring to FIG. 16B, forming the plugs 231 further includes planarizing the plug material layer 230, so that the first surface 101 is uncovered and plug material remains in the trenches 21 on top the sacrificial material 41. The plug material remaining on top of the sacrificial material 41 forms the plugs 231.

Referring to the examples illustrated in FIGS. 11 and 12A-12C, the gate electrodes 14 and gate dielectrics 15 can be formed in the trenches 21 of the trench structure 2 on top of the plugs 23 that close the cavities 22. FIGS. 17A-17E illustrate one example of a method for forming the gate electrodes 14 and the gate dielectrics 15 in this way. The method of forming the gate electrodes 14 and gate dielectrics 15 starts after forming the plugs 23 that close the cavities 22 inside the trenches 21.

Figure 17A:
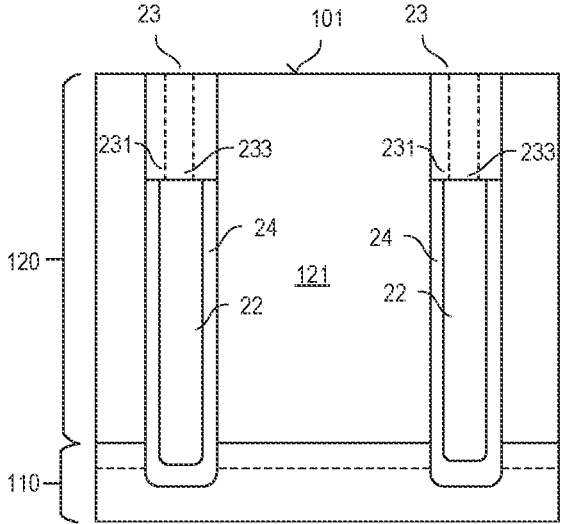
FIGS. 17A-17E illustrate one example of a method for forming gate electrodes and gate dielectrics in trenches of the trench structure.

FIG. 17A shows a vertical cross sectional view of the semiconductor body 100 after forming the plugs 23. The plugs 23 may be formed in accordance with the process according to FIGS. 14B-14G, so that the plugs 23 may include two plug sections 231, 233 that are formed in different process steps. These two plug sections 231, 233 illustrated in dashed lines in FIG. 17A. This, however, is only an example. It is also possible to form the plugs 23 in a different way.

Figure 17B:
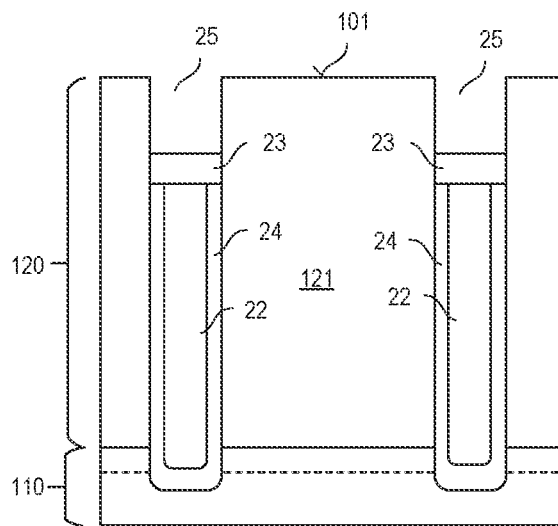

Referring to FIG. 17B, the method further includes partially removing each plug 23 to form a gap or trench 25 between the plug 23 and the first surface 101. The plug 23 remaining after the removal process still closes the respective void 23. According to one example, partially removing the plugs 23 includes a selective etching process in which the plugs 23 are etched selectively relative to the semiconductor material of the semiconductor body 100.

Figure 17C:
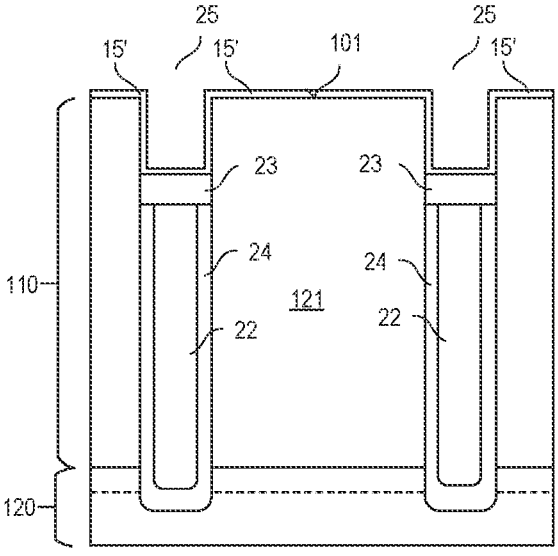
Figure 17D:
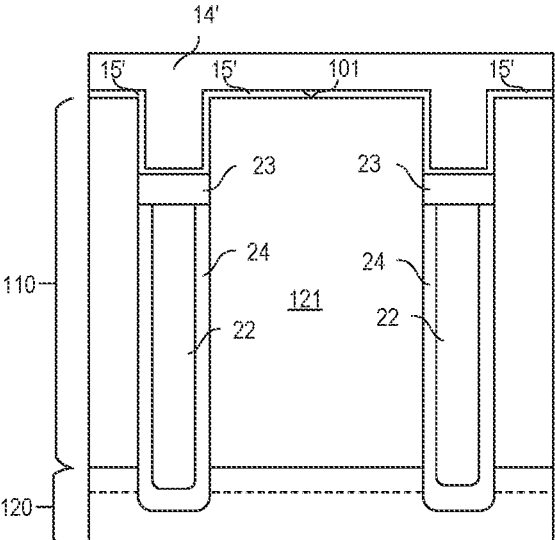
Figure 17E:
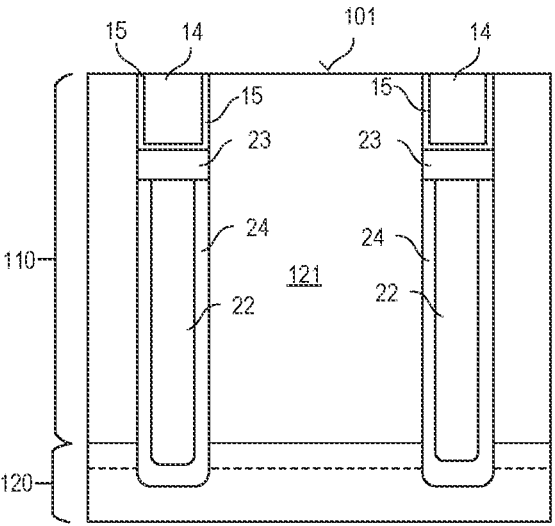

Referring to FIGS. 17C-17E, the method further includes forming the gate dielectrics 15 along sidewalls of the trenches 25 and forming the gate electrodes 14 in the trenches. The gate dielectric 15 may also cover the plugs 23 at the bottom of the trenches 25.

Referring to FIGS. 17C and 17D, forming the gate dielectrics 15 may include depositing a gate dielectric layer 15' on the first surface 101 of the semiconductor body 100, and on sidewalls and bottoms of the trenches 25, and forming the gate electrodes 14 in the trenches 25 may include depositing a gate electrode layer 14' such that the trenches 25 are completely filled and the gate dielectric layer 15' on top of the first surface 101 of the semiconductor body 100 is covered by the gate electrode layer 14'.

Referring to FIG. 17E, forming the gate electrodes 14 further includes removing the gate electrode layer 14' from the gate dielectric layer 15' on top of the first surface 101. Forming the gate dielectrics 15 may further include removing the gate dielectric layer 15' from the first surface 101. Removing the gate dielectric layer 15' from the first surface 101, however, is optional. Removing the gate electrode layer 14' from the gate dielectric layer 15' on top of the first surface 101 may include a planarizing process such as a chemical and/or mechanical polishing process, wherein the gate dielectric layer 15' on top of the first surface 101 may act as a stop layer. Removing the gate electrode layer 14' in a CMP process using the gate dielectric layer 15' as a stop layer may have the effect that the gate electrodes 14, after the CMP process, slightly extend beyond the first surface 101. According to one example, sections of the gate electrodes 14 that extend beyond the first surface 101 are removed in an etching process, wherein this etching process may be performed before or after removing the gate dielectric layer 15' from the first surface 101.

Referring to FIG. 14F and the corresponding description, forming a vacuum in the cavities 22 may include closing the cavities in a process that takes place in a low pressure atmosphere such as, for example, a HDP process. This, however, is only an example. Another example for producing a vacuum in the cavities is illustrated in FIGS. 18A-18D.

Figures 18A, 18B, 18C, 18D:
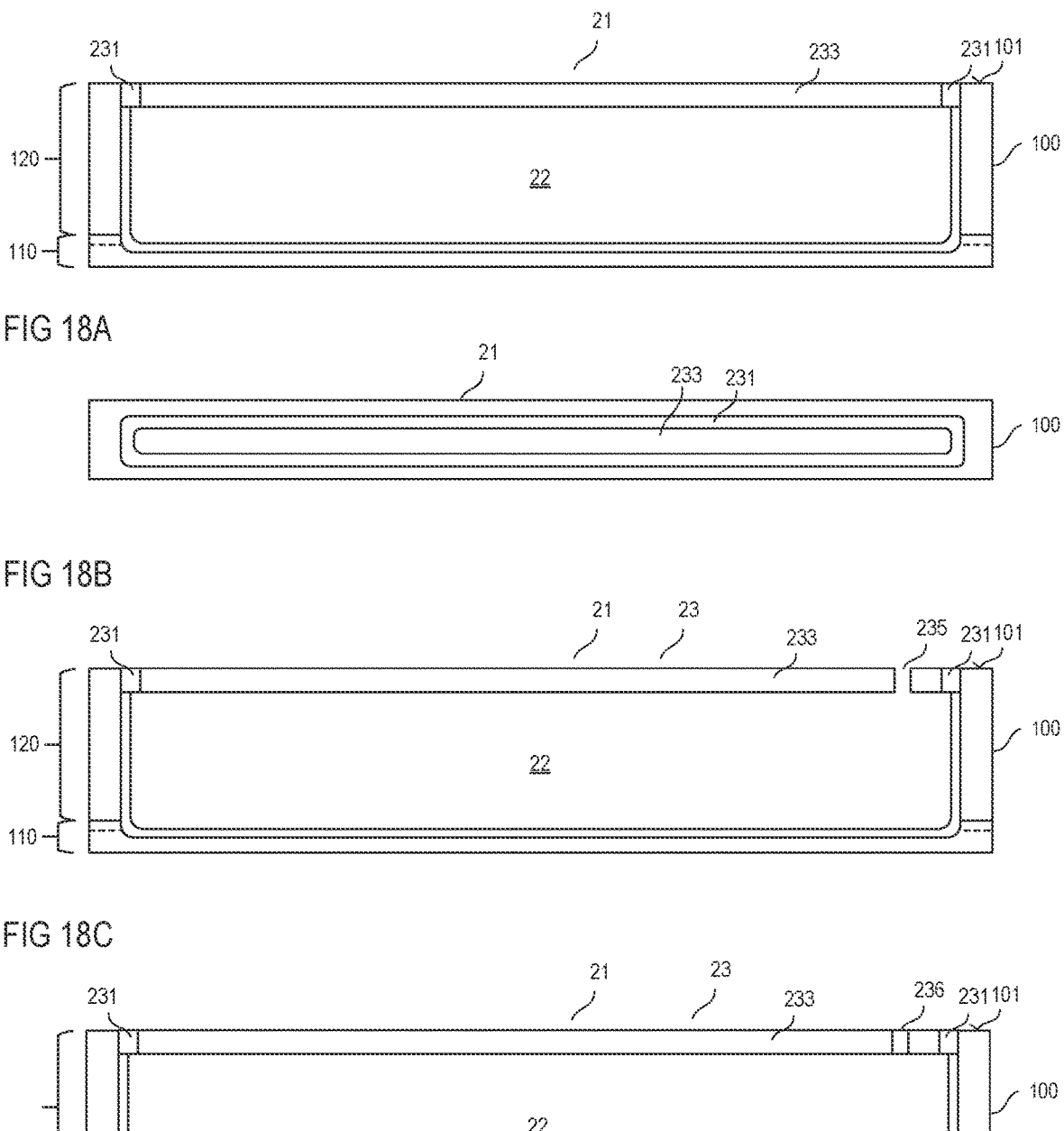
FIGS. 18A-18D illustrate one example of producing a vacuum in a cavity of a trench.

FIG. 18A shows a vertical cross sectional in a longitudinal direction and FIG. 18B shows a top view of one trench 21 after closing the cavity 22, that is after forming the plug 23. Forming the plug may include any suitable process, including the process according to FIGS. 14E-14G, wherein this process. That is, when using the method according to FIGS. 14E-14G the process of forming the plug material 233 that closes the cavity not necessarily takes place in a low pressure atmosphere. Instead, a sputter process may be used, for example.

Referring to FIG. 18C, the method further includes forming an opening 235 in the plug 23. Forming the opening 235 may include an etching process using an etch mask (not shown). According to one example, the opening 235 is formed in the region of a longitudinal end of the trench 21. Referring to the above, the longitudinal end may be arranged in an edge region of the semiconductor body 100.

Referring to FIG. 18D, the method further include forming a further plug 236 that fills the opening 235 and therefore closes the cavity 22. Forming the further plug 236 may take place in a low pressure atmosphere, so that a vacuum is produced in the cavity. The process of forming the further plug 236 may include an HDP process, for example.

Figure 19A:
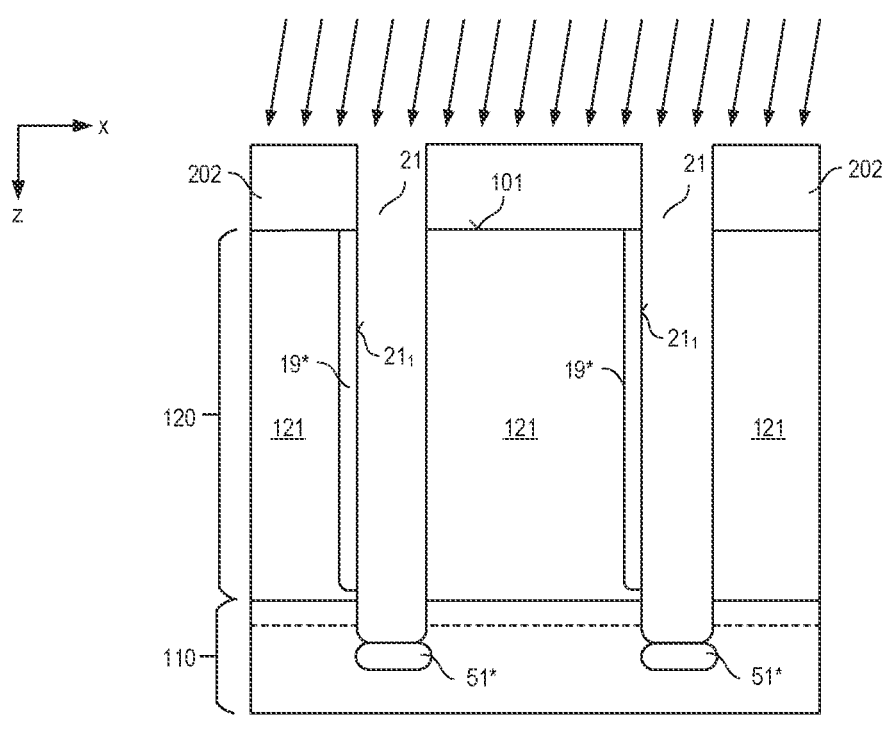
FIGS. 19A-19C illustrate one example of a method for forming compensation regions along trenches of the trench structure.
Figure 19B:
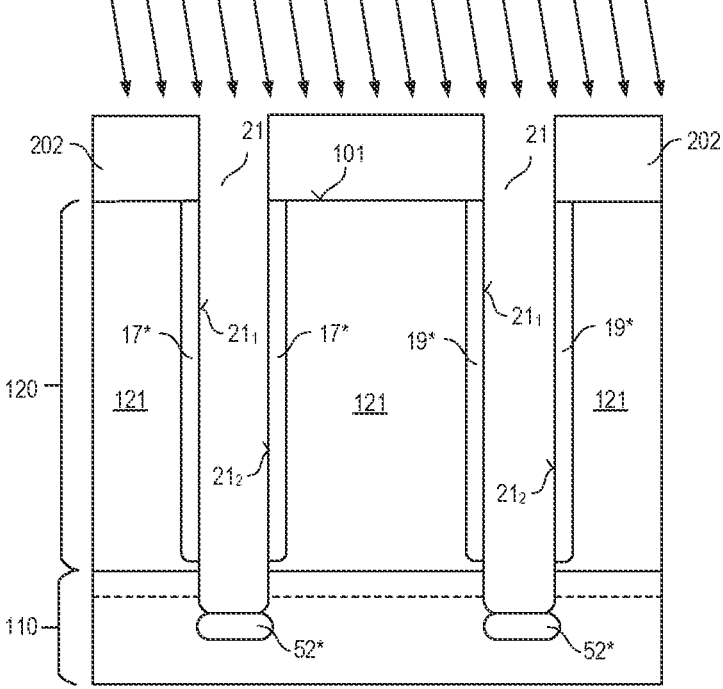
Figure 19C:
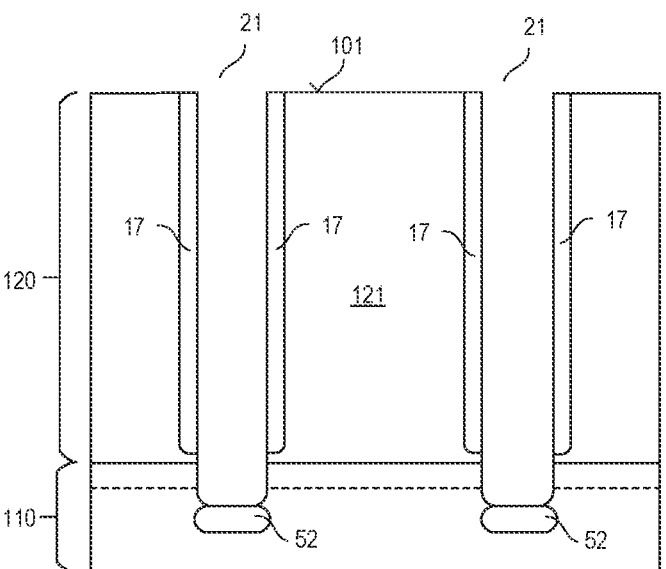

Referring to FIGS. 8-10 and 12A-12C, the transistor cells 1 may be implemented as superjunction transistor cells, wherein each of these transistor cells 1 includes at least one compensation region 17 of the second doping type. FIGS. 19A-19C illustrate one example of a method for forming compensation regions 17 along sidewalls of the trenches 21. According to this example, forming the compensation regions 17 includes implanting dopant atoms via sidewalls of the trenches 21 into the mesa regions 121 before closing the trenches 21. Each of FIGS. 19A-19C shows a vertical cross sectional view of one section of the semiconductor body 100 at different stages of the process.

Referring to FIG. 19A, the method includes at least one first implantation process in which dopant atoms of the second doping type are implanted via the first sidewalls 211 of the trenches 21 into the mesa regions 121 to form implanted regions 17* in the mesa regions 121 along the first sidewalls 211. Referring to FIG. 19A, an implantation mask 202 may be formed on top of the first surface 101 before the implantation process, wherein the implantation mask 202 is configured to prevent dopant atoms from being implanted into the first surface 101. According to one example, the implantation mask 202 is the same as the etch mask 201 (see FIG. 14A) used in the etching process for forming the trenches 21.

Referring to FIG. 19B, the method further includes at least one second implantation process in which dopant atoms of the second doping type are implanted into the mesa regions 121 via the second sidewalls 212 opposite the first sidewalls 211 of the trenches 21, so that implanted regions 17* are formed in the mesa regions 121 along the second sidewalls 212.

Referring to FIGS. 19A and 19B, the implanted regions 17*, in the vertical direction z extend from the first surface 101 towards the first semiconductor layer 110. Dimensions of the implanted regions 17* in the vertical direction z are dependent on implantation angles used in the first and second implantation processes. The vertical dimensions of the implanted regions 17* can be adjusted by suitably selecting the implantation angles dependent on the widths of the trenches 21 and the thickness of the implantation mask 202. The thickness of the implantation mask 202 is the dimension of the implantation mask 202 in the vertical direction z. Basically, at a given width of the trenches 21 and a given thickness of the implantation mask 202, the smaller the implantation angle relative to the vertical direction z, the deeper the implanted regions 17* extend in the vertical direction z into the mesa regions 121. Referring to FIGS. 19A and 19B, the implantation angles may be adjusted such that the implanted regions 17* are spaced apart from the first semiconductor layer 110 in the vertical direction z. This, however, is only an example. According to another example, the implantation angles are adjusted such that the implanted regions 17* extend into the first semiconductor layer 110.

Referring to FIG. 19C, the method further includes an annealing process in which the implanted dopant atoms of the second doping type are activated, so that the compensation regions 17 are formed based on the implanted regions 17*. According to one example, the annealing process takes place at temperatures of between 1500° C. and 1800° C. The implantation doses in the first and second implantation process, dependent on the implantation angles, are adjusted such that the compensation regions 17 have a desired doping concentration. According to one example, doping concentrations of the compensation regions 17 are selected from between 5E16 cm$^{-3}$ and 2E18 cm$^{-3}$.

In the first and second implantation processes according to FIGS. 19A and 19B, some of the dopant atoms may be scattered at the first and second sidewalls 211, 212, so that a portion of the dopant atoms may be scattered, wherein some of the scattered dopant atoms may end up in the first semiconductor layer 110 below the bottom of the respective trench 21. In FIG. 19A, reference number 51* denotes implanted regions that result from scattered dopant atoms in the at least one first implantation process. Reference number 52* in FIG. 19B denotes implanted regions that include scattered dopant atoms from the at least one first implantation process and scattered dopant atoms from the at least one second implantation process. In the annealing process according to FIG. 19C, regions 52 are formed in the first semiconductor layer 110 below the trench bottoms that include dopant atoms of the second doping type. These regions 52 result from scattered dopant atoms in the first and second implantation processes. According to one example, the doping concentration of the first doping type of the first semiconductor layer 110 is significantly higher than a doping concentration of dopant atoms of the second doping in regions 52. Thus the regions 52 have an effective doping concentration of the first doping type, so that the scattered dopant atoms of the second doping type do not negatively affect the functionality of the transistor device.

Figure 20A:
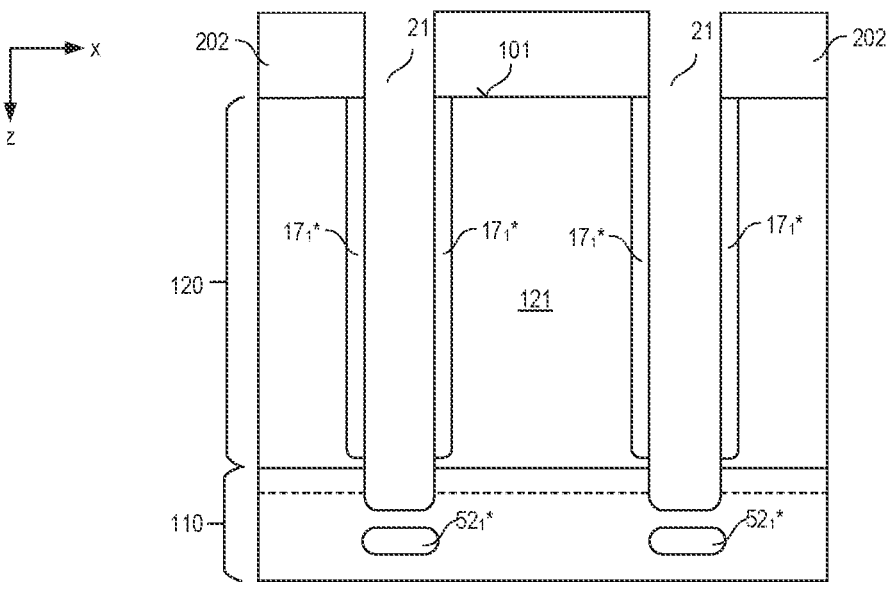
FIGS. 20A-20C illustrate a modification of the method according to FIGS. 19A-19C.
Figure 20B:
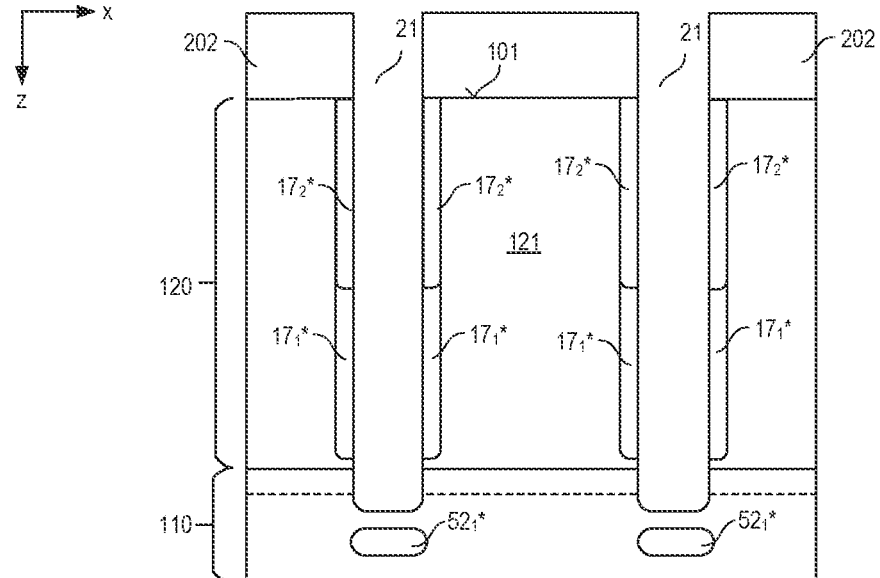
Figure 20C:
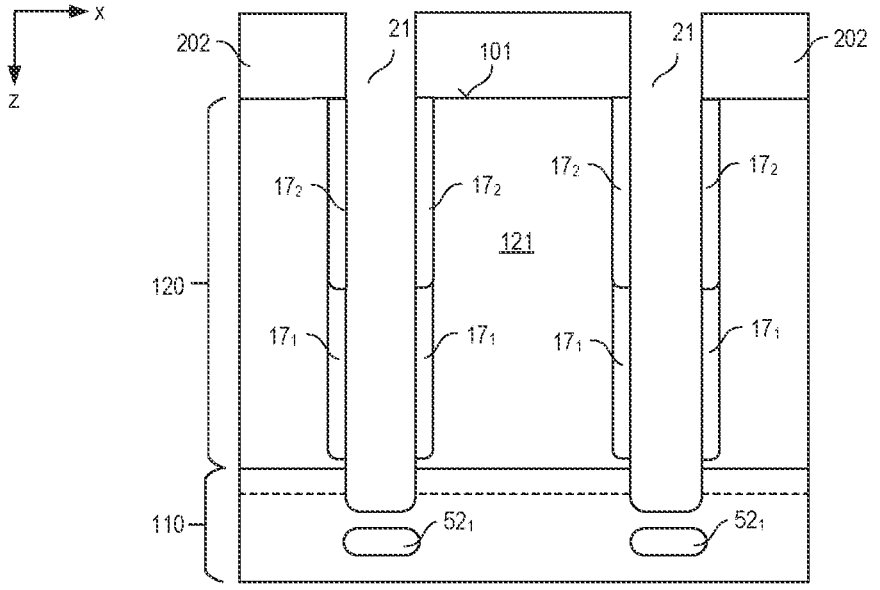

According to one example, forming the compensation regions may include forming the compensation regions 17 such that the compensation regions have different sections with different doping concentrations. According to one example, each of the compensation regions 17 have two different sections, a first section with a first doping concentration and a second section with a second doping concentration, wherein the first sections is closer to the first surface 101 and has a higher doping concentration than the second section. FIGS. 20A-20C illustrate one example of a method for forming the compensation regions 17 in this way.

Referring to FIG. 20A, the method includes forming first implanted regions 171* along the first and second sidewalls 211, 212 of the trenches 21, wherein each of these implanted regions 171* may be formed in accordance with the method explained with reference to FIGS. 19A and 19B.

Referring to FIG. 20B, the method further includes forming second implanted regions 172* along each of the first and second sidewalls 211, 212, wherein these second implanted regions 172* extend less deep in the vertical direction z than the first implanted regions 171*. The second implanted regions 172* include dopant atoms that are implanted in the process according to FIG. 20A and additional dopant atoms implanted in the implantation process according to FIGS. 20B, so that the second implanted regions 172* include a higher dopant dose of second doping atoms than the first implanted regions 171* below the second implanted regions 172*.

After the annealing process illustrated in FIG. 20C, the compensation regions 17 each include two sections with different doping concentrations, first sections 171 that include dopant atoms only from the implantation processes according to FIGS. 20A, and second sections 172 that include dopant atoms from both, the implantation processes according to FIG. 20A and the implantation processes according to FIG. 20B. Of course, the order in which the implantation processes according to FIGS. 20A and 20B are performed can be changed, so that the implantation process according to FIG. 20B may take place before the implantation process according to FIG. 20A.

The source and body regions 12, 13 of the transistor cells 1 may be formed by implanting dopant atoms via the first surface 101 into the mesa regions 121. These source regions 12 and the body regions 13 may be formed before or after forming the trench structure. Gate electrodes 14 and gate dielectrics 15 that are not arranged in the trenches of the trench structure, as illustrated in FIGS. 5-7, for example, may be formed by forming trenches in the mesa regions 121, forming the gate dielectrics 15 along bottoms and sidewalls of these trenches and filling the trenches with a gate electrode material in order to form the gate electrodes 14. A process of this type is commonly known, so that no further explanation is required in this regard. According to one example, the gate electrodes 14 and gate dielectrics 15 according to FIGS. 5-7 are formed after implantation processes in which the source and body regions 12, 13 are formed. Equivalently, the optional JFET-regions 16 may be formed by implanting dopant atoms via the first surface 101 into the semiconductor body. Equivalently, the current spreading regions 90 according to FIGS. 12A-12C may be formed by implanting dopant atoms via the first surface 101 into the semiconductor body, wherein forming these current spreading regions 19 may include a masked implantation process, that is, an implantation process in which portions of the first surface 101 are covered so that the dopant atoms are only implanted into those regions in which the current spreading regions 19 are to be formed.

Referring to FIGS. 19A-19C and 20A-20C, the compensation regions 17 may be formed such that, they extend to the first surface 101, wherein a doping concentration of the of the source and body regions 12, 13 may be adjusted such that they overcompensate sections of the compensation regions 17 in regions close to the first surface 101. In this case, the source and body regions 12, 13, in regions along the trenches 21 and, therefore, in regions along the gate dielectric 14 include dopant atoms that result from the respective implantation process for forming the source and body regions 12, 13 and that result from the implantation process for forming the compensation regions 17.

FIGS. 21A-21D illustrate one example of a method forming a superjunction device in which forming the compensation regions 17 does not affect the doping concentration of the source and body regions 12, 13, so that the doping of the source and body regions 12, 13 is only dependent on implantation processes for forming the source and body regions 12, 13. This method is based on the process explained with reference to FIGS. 17A-17D in which the gate electrode 14 and the gate dielectric 15 are formed in a gate trench 25 above the cavity 22 and is different from the method according to FIGS. 17A-17D in that forming the gate trenches 25 includes removing doped sections that include dopant atoms of the second type that result from implanting dopant atoms of the second doping type via the trench sidewalls.

Figures 21A, 21B:
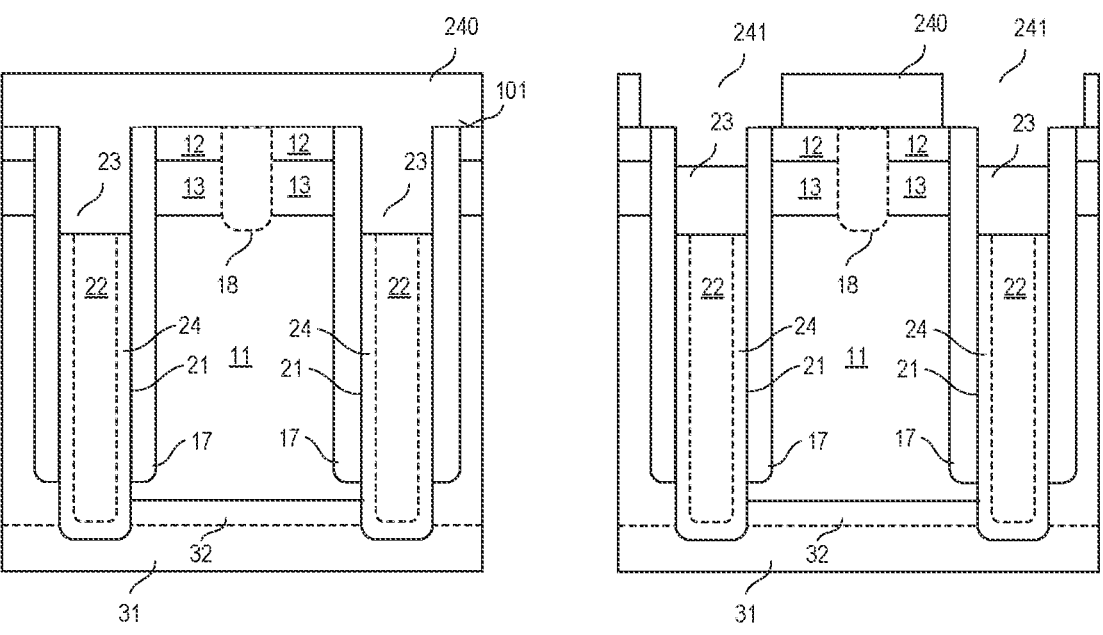
FIGS. 21A-21D illustrate another example of a method for forming gate electrodes and gate dielectrics in trenches of the trench structure.

FIG. 21A shows a vertical cross sectional view of the semiconductor body 100 after forming the compensation regions 17 along sidewalls of the trenches and after forming the cavities 22 inside the trenches but before forming the gate electrodes 14 and gate dielectrics 15. Just for the purpose of illustration it is assumed that the source and body regions 12, 13 and the optional breakthrough regions 18 have been formed before forming the gate electrodes 14 and gate dielectrics. These regions 12, 13, 18 may be formed by implantation processes (a) before forming the compensation regions 17 and even before forming the trenches 21, (b) after forming the compensation regions 17 and before forming the gate electrodes 14 and gate dielectrics 15, or (c) after forming the gate electrodes 14 and gate dielectrics 15. As outlined above, forming any one of the doped regions may include a respective implantation process and an annealing process for activating the implanted dopant atoms. At least one annealing process is used, that is different annealing processes or a common annealing process may be used to activate the dopant atoms resulting from the different implantation processes. The at least one annealing process may take place before or after the process steps explained with reference to FIGS. 21A-21D.

In connection with FIGS. 21A-21D "compensation region 17" denotes any region that includes dopant atoms of the second doping type introduced into the semiconductor body 100 in a sidewall implantation process in accordance with any one of FIG. 19A-19C or 20A-20C. Thus, a compensation region 17 as used in connection with FIGS. 21A-21D may include further dopant atoms, such as dopant atoms resulting from implantation process for forming the source and body regions 12, 13. Furthermore, a compensation region 17 as used in connection with FIGS. 21A-21D may already have been annealed or may be annealed at a later stage.

In FIG. 21A, reference number 240 denotes a plug layer that forms the plugs 23 closing the cavities inside the trenches and that covers the first surface 101. This plug layer may correspond to the combination of layers 231 and 234 explained with reference to FIG. 14F.

Figures 21C, 21D:
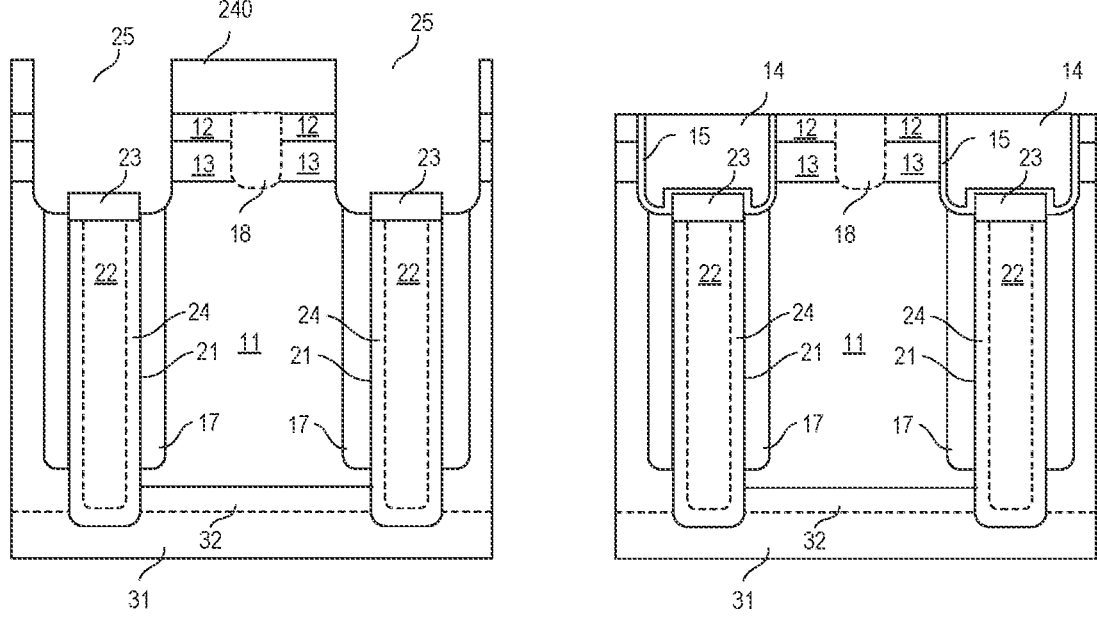

Referring to FIGS. 21B and 21C, the method includes forming the gate trenches 25 such that the gate trenches 25 are wider than the trenches 21. Furthermore, forming the gate trenches 25 includes removing the compensation regions 17 in those regions in which the gate trenches 25 are formed, so that, in the finished device, sidewalls of the gate trenches adjoin the source and body regions 12, 13 (which may already have been formed at the time of forming the gate trenches 25 or which may be formed later).

Referring to FIG. 21B, forming the gate trenches 25 may include forming openings 241 in the plug layer 240 above the trenches 21 such that the openings uncover those sections of the first surface 101 below which the compensation regions 17 have been formed. Forming the openings 241 may also include partially removing plug material from the trenches 21, wherein sections of the plug material that form the plugs 23 in the finished device remain. Forming the openings may include forming an etch mask (not shown) on top of the plug layer and etching the plug layer 240 using the etch mask.

Referring to FIG. 21C, forming the gate trenches 25 further includes an anisotropic etching process that etches those sections of the semiconductor body 100 that are not covered by the plug layer 240, so that the compensation regions 17 are removed along the gate trenches. This etching process may also partially remove the plugs 23, so that the plugs 23 may have a reduced thickness after the etching process, but still close the cavities 22.

Referring to FIG. 21D, the method further includes forming the gate dielectrics 15 and the gate electrodes 14 in the gate trenches 25. The gate dielectrics 15 and the gate electrodes 14 may be formed in accordance with the method steps explained with reference to FIGS. 17C-17E.

Referring to FIG. 21D, the body regions 13 are formed such that sections of the drift region 11 adjoin the gate trenches between the body regions 13 and the compensation regions 17. Thus, the body regions 13, which are connected to the source node S (not shown in FIG. 21D, are spaced apart from the compensation regions 17, so that the compensation regions 17 are not connected to the source node S via the body regions 13.

For connecting the compensation regions 17 to the source node S, the transistor device may include contact regions of the second doping type. A transistor that includes contact regions of the second doping type for connecting the compensation regions 17 to the source node S is illustrated in FIGS. 22A-22C. FIG. 22A shows a top view of a transistor device of the type shown in FIGS. 21A-21C that includes contact regions 71 of the second doping type, FIG. 22B shows a vertical cross sectional view in a region that includes a contact region 71, and FIG. 22C shows a vertical cross sectional view in a region that includes source and body regions 12, 13, wherein FIG. 22C corresponds to FIG. 21D.

The contact regions 71 are connected to the source node S (not shown in FIGS. 22A-22C) and, in the vertical direction extend from the first surface 101 to the compensation regions 17. Referring to FIG. 22A, several contact regions 71 may be arranged spaced apart from each other in the longitudinal direction of the trenches 21 (out of view in FIG. 22A), wherein source regions 12 and body regions 13 (out of view in FIG. 22A) are arranged between neighboring contact regions 71. Thus, one compensation region 17 may be contacted by two or more contact regions 71.

Referring to FIG. 22A, one contact region 71, may extend across the mesa region 121 from one gate trench to another gate trench. This, however, is only an example. According to another example, illustrated in FIG. 23, each of the contact regions 71 may adjoin one gate trench and may be spaced apart from the neighboring gate trench.

The contact regions 71 may be formed by masked implantation process in the same way the source and body regions 12, 13 and the optional breakthrough regions 18 are formed. According to one example the contact regions 71 are formed by the same implantation process(es) that form(s) the breakthrough regions 18. Referring to FIGS. 22A and 23 each of the contact regions 71 may adjoin one or more breakthrough regions 18.

Figure 24A:
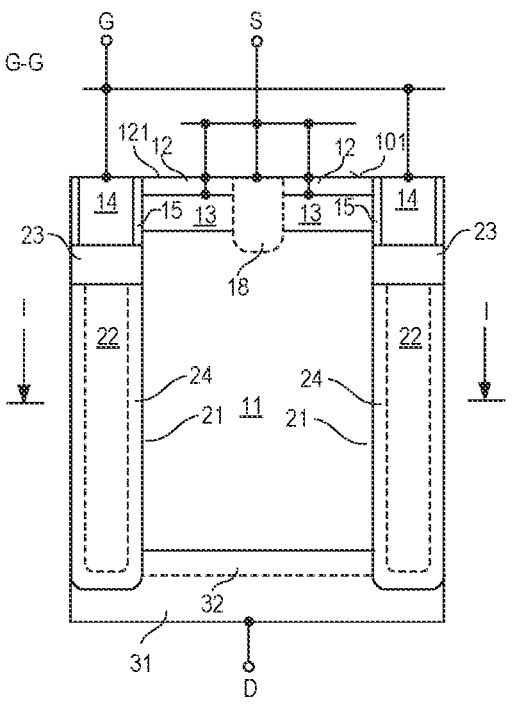
FIGS. 24A-24D illustrate different views of a superjunction transistor device according to another example.
Figure 24B:
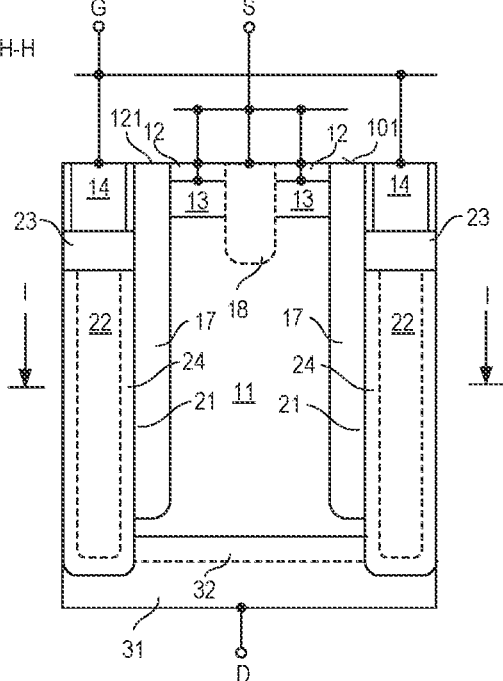
Figure 24C:
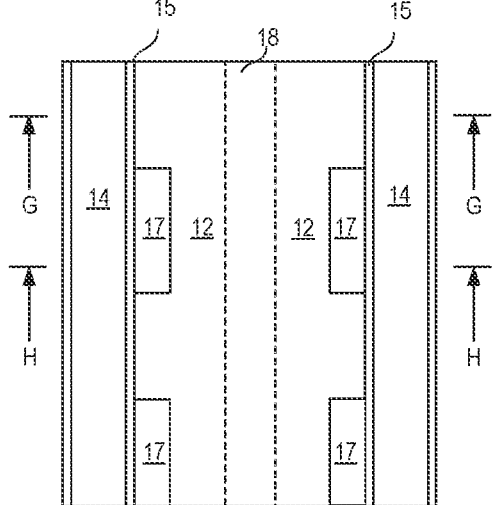
Figure 24D:
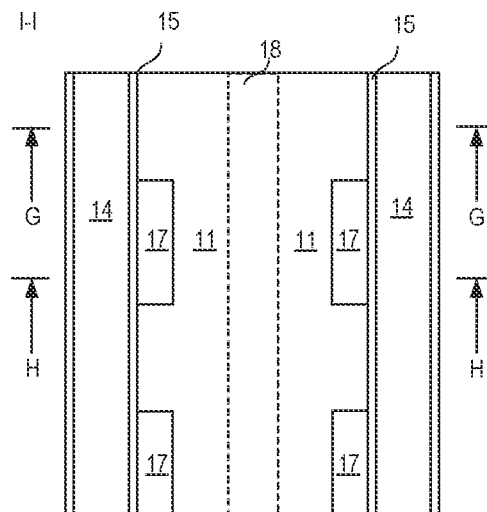

FIGS. 24A-24D illustrate a further example of a super-junction transistor device that includes gate electrodes 14 and gate dielectrics 15 above respective cavities 22. FIG. 24A shows a vertical cross sectional view of one section of the transistor device in a first vertical section plane G-G, FIG. 24B shows a vertical cross sectional view of one section of the transistor device in a second vertical section plane H-H, FIG. 24C shows a top view, and FIG. 24D shows a horizontal cross sectional view in a section plane I-I extending through the drift region 11.

In connection with FIGS. 24A-24D "compensation region 17" denotes any region that includes dopant atoms of the second doping type introduced into the semiconductor body 100 in a sidewall implantation process. Thus, a compensation region 17 as used in connection with FIGS. 24A-24D may include further dopant atoms, such as dopant atoms resulting from implantation process for forming the source and body regions 12, 13. Furthermore, a compensation region 17 as used in connection with FIGS. 24A-24D may already have been annealed or may be annealed at a later stage.

Referring to FIGS. 24A-24D, each transistor cell includes several compensation regions 17 that are spaced apart from each other along a respective trench, wherein the compensation regions 17 may extend along the gate dielectrics to the first surface 101. In sections between neighboring compensation regions 17, source and body regions 12, 13 adjoin the respective gate dielectric 15. The compensation regions 17 adjoin the body regions 13, so that the compensation regions 17 are connected to the source node S via the body regions 13.

Figure 25:
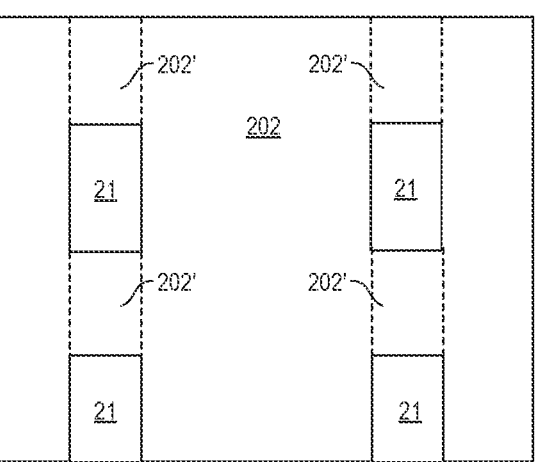
FIG. 25 shows a top view of an implantation mask that may be used in a process of forming compensation regions of the transistor device according to FIGS. 24A-24D.

Compensation regions 17 of the type shown in FIGS. 24A-24D may be formed by any one of the processes illustrated in FIGS. 19A-19C and 20A-20C, wherein the implantation mask 202 is formed such that it partially covers the trenches, so that in the implantation process dopant atoms of the second doping type are implanted only into sidewalls of those sections. That is, the implantation mask is formed such that it covers those trench sections in which compensation regions 17 are not to be formed. A top view of an implantation mask 202 of this type is illustrated in FIG. 25. In FIG. 25, reference numbers 202' denote those sections of the implantation mask that cover sections of the trench 21. The dashed lines illustrate the position of the trenches below the implantation mask 202.

In the examples explained above, the drift regions 11 of the transistor cells 1 are formed by sections of the mesa regions 121 that have the basic doping. This, however, is only an example. According to another example, illustrated in FIGS. 26A-26C the drift regions 11 are doped regions that have a dimension in the first lateral direction that is significantly lower than a width of the mesa region (the distance) between the trenches 21. Drift regions 11 of this type may be produced in the same way as the compensation regions 17, that is, by implanting dopant atoms (of the first doping type) via the first and second sidewalls of the trenches 21 into the mesa regions 121, wherein implantation energies and implantation angles in the process of forming the compensation regions 17 and the process of forming the drift regions 11 are adapted to one another such that the compensation regions 17 and the drift regions 11 are arranged next to each other in the first lateral direction.

Figure 26A:
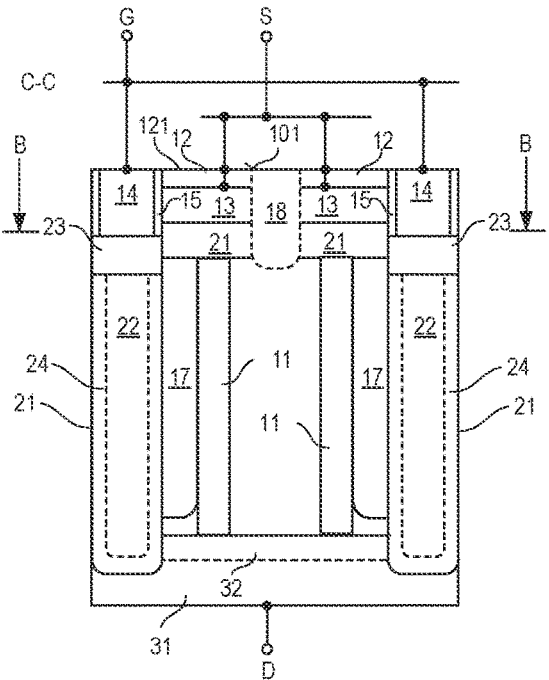
FIGS. 26A-26C and 27 illustrate transistor devices according to further examples.
Figure 26B:
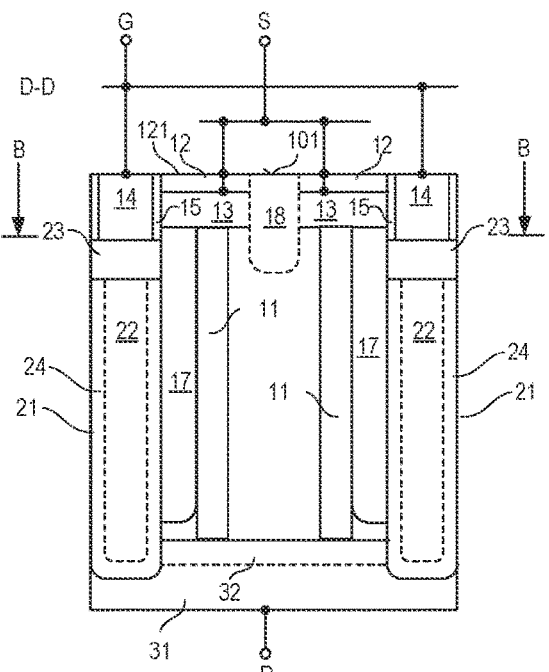
Figure 26C:
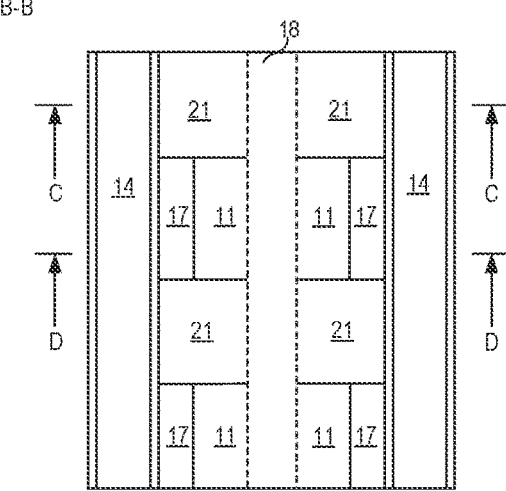

The example shown in FIGS. 26A-26C is based on the example shown in FIGS. 12A-12C, so that the drift regions 11 extend from the current spreading regions 19 to the drain region 31 or the optional buffer region 32.

Figure 27:
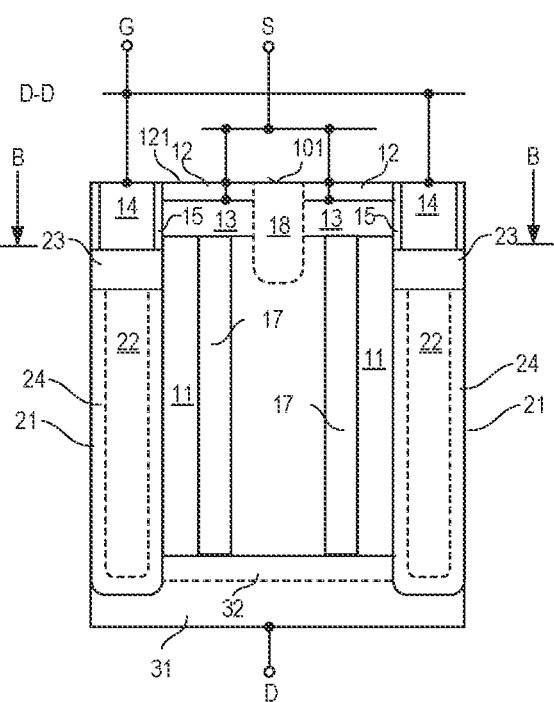

In the example shown in FIGS. 26A-26C, the compensation regions 17 are arranged between the drift regions 11 and the trenches 21. This, however, is only an example. According to another example illustrated in FIG. 27, the drift regions 11 are arranged between the compensation regions 17 and the trenches 21. In this example, the current spreading regions 19 can be omitted.

In the examples according to FIGS. 26A-26C and 27, the second semiconductor layer 120 may be formed as an intrinsic layer. Furthermore, in these examples, dopant doses included in the compensation regions 17 and the drift regions 11 can precisely be adjusted by suitably adjusting the implantation doses in the processes of forming the drift and compensation regions 11, 17.

Some of the aspects explained above are summarized in the following by way of numbered examples.

Example 1—A transistor device, comprising: a SiC semiconductor body that includes a first semiconductor layer and a second semiconductor layer formed on top of the first semiconductor layer; a trench structure extending from a first surface of the semiconductor body through the second semiconductor layer into the first semiconductor layer; a drain region arranged in the first semiconductor layer; and a plurality of transistor cells each coupled between the drain region and a source node, wherein the trench structure subdivides the second semiconductor layer into a plurality of mesa regions, wherein the trench structure comprises at least one cavity, and wherein at least one of the plurality of transistor cells is at least partially integrated in each of the mesa regions.

Example 2—The transistor device of example 1, wherein a pressure in the at least one cavity is less than 1% of atmospheric pressure.

Example 3—The transistor device according to example 1 or 2, wherein the at least one cavity, in a vertical direction of the semiconductor body extends into the first semiconductor layer.

Example 4—The transistor device of any one of examples 1 to 3, wherein the trench structure further comprises a dielectric layer arranged between the at least one cavity and the semiconductor body.

Example 5—The transistor device of any one of examples 1 to 4, wherein the trench structure comprises a plurality of parallel first trenches, wherein each of the mesa regions is arranged between a respective pair of neighboring ones of the parallel trenches.

Example 6—The transistor device of example 5, wherein the trench structure further comprises at least one second trench crossing the first trenches.

Example 7—The transistor device of any one of examples 1 to 6, wherein each of the transistor cells comprises: a drift region and a source region of a first doping type; a body region of a second doping type arranged between the drift region and the source region; and a gate electrode arranged adjacent to the body region and dielectrically insulated from the body region by a gate dielectric.

Example 8—The transistor device of any one of examples 1 to 7, wherein each of the transistor cells further comprises: at least one compensation region of the second doping type arranged adjacent to the drift region.

Example 9—The transistor device of example 8, wherein each of the transistor cells comprises a plurality of compensation regions that each adjoin a respective one of the trenches and are spaced apart from each other in a longitudinal direction of the respective one of the trenches.

Example 10—The transistor device of example 8 or 9, wherein the at least one compensation region is an implanted semiconductor region.

Example 11—The transistor device of any one of examples 7 to 10, wherein the second semiconductor layer has a basic doping concentration, and wherein the drift region is formed by a section of the mesa region that has the basic doping concentration.

Example 12—The transistor device of any one of examples 7 to 10, wherein the drift region is an implanted semiconductor region.

Example 13—The transistor device of any one of examples 7 to 12, wherein the gate electrode is arranged in a trench that is spaced apart from the trench structure.

Example 14—The transistor device of any one of examples 7 to 12, wherein the gate electrode is arranged in a gate trench, and wherein the gate trench is formed by a section of a trench of the trench structure and is arranged above a plug that closes the cavity.

Example 15—The transistor device of any one of examples 7 to 11, wherein the gate electrode is arranged in a gate trench, wherein the gate trench adjoins a trench of the trench structure and is wider than the trench of the trench structure.

Example 16—A method, comprising: forming a trench structure in a SiC semiconductor body such that that the trench structure extends from a first surface of the semiconductor body through a second semiconductor layer into a first semiconductor layer and such that the trench structure subdivides the second semiconductor layer into a plurality of mesa regions; and forming at least one transistor cell at least partially in each of the mesa regions, wherein the trench structure comprises at least one cavity.

Example 17—The method of example 16, wherein a pressure in the at least one cavity is less than 1% of atmospheric pressure.

Example 18—The method of example 16 or 17, wherein forming the trench structure comprises: forming a plurality of trenches that each extend from the first surface of the semiconductor body through the second semiconductor layer into the first semiconductor layer; forming a cavity and a plug closing the cavity in each of the trenches.

Example 19—The method of example 18, wherein forming the cavity and the plug comprises, in each of the trenches: forming a sacrificial plug that partially fills the respective trench; forming a first plug on top of the sacrificial plug; forming an opening in the first plug; removing the sacrificial plug in an etching process via the opening to form the cavity; and closing the opening in the first plug to form the plug closing the cavity.

Example 20—The method of example 19, wherein closing the opening includes a deposition process in an atmosphere in which the pressure is less than 1% of atmospheric pressure.

Example 21—The method of example 20, wherein the process is an HDP process.

Example 22—The method of example 19, further comprising: forming an opening in the plug, and closing the opening using a deposition process in an atmosphere in which the pressure is less than 1% of atmospheric pressure.

Example 23—The method of any one of examples 16 to 22, wherein forming each of the transistor cells comprises: forming a source region of a first doping type; forming a body region of a second doping type; and forming a gate electrode arranged adjacent to the body region and dielectrically insulated from the body region by a gate dielectric.

Example 24—The method of example 23, wherein forming the gate electrode comprises forming the gate electrode in a gate trench that is spaced apart from the trench structure.

Example 25—The method of example 23, wherein forming the gate electrode comprises forming the gate electrode in a gate trench that is formed by a section of a trench of the trench structure and is arranged above the plug that closes the cavity.

Example 26—The method of example 23, wherein forming the gate electrode comprises forming the gate electrode in a gate trench, wherein the gate trench adjoins a trench of the trench structure and is wider than the trench of the trench structure.

Example 27—The method of any one of examples 16 to 26, wherein forming each transistor cell comprises forming at least one compensation region, and wherein forming the at least one compensation region comprises implanting dopant atoms via sidewalls of the trenches into the mesa regions.

Example 28—The method of examples 26 and 27, wherein forming the gate trench comprises partially removing the at least one compensation region.

What is claimed is:

1. A transistor device, comprising:
a SiC semiconductor body that includes a first semiconductor layer and a second semiconductor layer formed on top of the first semiconductor layer;
a trench structure extending from a first surface of the semiconductor body through the second semiconductor layer into the first semiconductor layer;
a drain region arranged in the first semiconductor layer; and
a plurality of transistor cells each coupled between the drain region and a source node,
wherein the trench structure subdivides the second semiconductor layer into a plurality of mesa regions,
wherein the trench structure comprises at least one cavity,
wherein at least one of the plurality of transistor cells is at least partially integrated in each of the mesa regions,
wherein the at least one cavity of the trench structure is sealed by a plug of dielectric material,
wherein each of the transistor cells comprises:
a drift region and a source region of a first doping type;
a body region of a second doping type arranged between the drift region and the source region; and
a gate electrode arranged adjacent to the body region and dielectrically insulated from the body region by a gate dielectric,
wherein the gate electrode is arranged in a trench that is spaced apart from the trench structure.

2. The transistor device of claim 1, wherein a pressure in the at least one cavity is less than 1% of atmospheric pressure.

3. The transistor device of claim 1, wherein the at least one cavity, in a vertical direction of the semiconductor body, extends into the first semiconductor layer.

4. The transistor device of claim 1, wherein the trench structure comprises a plurality of parallel first trenches, and wherein each of the mesa regions is arranged between a respective pair of neighboring ones of the parallel trenches.

5. A method, comprising:
  forming a trench structure in a SiC semiconductor body such that that the trench structure extends from a first surface of the semiconductor body through a second semiconductor layer into a first semiconductor layer and such that the trench structure subdivides the second semiconductor layer into a plurality of mesa regions;
  forming at least one transistor cell at least partially in each of the mesa regions,
  wherein the trench structure comprises at least one cavity,
  wherein forming the trench structure comprises:
    forming a plurality of trenches that each extend from the first surface of the semiconductor body through the second semiconductor layer into the first semiconductor layer; and
  forming a cavity and a plug closing the cavity in each of the trenches, and
  wherein forming the cavity and the plug comprises, in each of the trenches:
    forming a sacrificial plug that partially fills the respective trench;
    forming a first plug on top of the sacrificial plug;
    forming an opening in the first plug;
    removing the sacrificial plug in an etching process via the opening to form the cavity; and
    closing the opening in the first plug to form the plug closing the cavity,
  wherein forming each transistor cell comprises forming at least one compensation region, and wherein forming the at least one compensation region comprises implanting dopant atoms via sidewalls of the trenches into the mesa regions.

6. A transistor device, comprising:
a SiC semiconductor body that includes a first semiconductor layer and a second semiconductor layer formed on top of the first semiconductor layer;
a trench structure extending from a first surface of the semiconductor body through the second semiconductor layer into the first semiconductor layer;
a drain region arranged in the first semiconductor layer; and
a plurality of transistor cells each coupled between the drain region and a source node,
wherein the trench structure subdivides the second semiconductor layer into a plurality of mesa regions,
wherein the trench structure comprises at least one cavity,
wherein at least one of the plurality of transistor cells is at least partially integrated in each of the mesa regions,
wherein the at least one cavity of the trench structure is sealed by a plug of dielectric material,
wherein each of the transistor cells comprises:
  a drift region and a source region of a first doping type;
  a body region of a second doping type arranged between the drift region and the source region; and
  a gate electrode arranged adjacent to the body region and dielectrically insulated from the body region by a gate dielectric,
wherein each of the transistor cells further comprises:
  at least one compensation region of the second doping type arranged adjacent to the drift region,
wherein each of the transistor cells comprises a plurality of compensation regions that each adjoin a respective one of the trenches and are spaced apart from each other in a longitudinal direction of the respective one of the trenches.

* * * * *